(12) United States Patent
Yamazaki

(10) Patent No.: US 6,207,969 B1
(45) Date of Patent: *Mar. 27, 2001

(54) SEMICONDUCTOR THIN FILM AND SEMICONDUCTOR DEVICE

(75) Inventor: Shunpei Yamazaki, Tokyo (JP)

(73) Assignee: Semiconductor Energy Laboratory Co., Ltd., Kanagawa-ken (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/878,505

(22) Filed: Jun. 18, 1997

(30) Foreign Application Priority Data

Jun. 18, 1996 (JP) .................................................. 8-178509

(51) Int. Cl.$^7$ ........................... H01L 29/78; H01L 29/04; H01L 31/036
(52) U.S. Cl. ................... 257/49; 257/57; 257/59
(58) Field of Search .................................. 257/49, 57, 59

(56) References Cited

U.S. PATENT DOCUMENTS

| | | | |
|---|---|---|---|
| 5,302,230 | * | 4/1994 | Ino et al. . |
| 5,352,291 | * | 10/1994 | Zhang et al. . |
| 5,456,763 | * | 10/1995 | Kaschmitter et al. . |
| 5,521,107 | * | 5/1996 | Yamazaki et al. . |
| 5,696,003 | * | 12/1997 | Makita et al. . |
| 5,766,344 | * | 6/1998 | Zhang et al. . |

* cited by examiner

*Primary Examiner*—Stephen D. Meier
(74) *Attorney, Agent, or Firm*—Fish & Richardson P.C.

(57) ABSTRACT

A crystalline silicon film having a region that can substantially be regarded as a single crystal is formed by subjecting a crystalline silicon film formed by a heat treatment, for instance, to a thermal oxidation step that is performed at a higher temperature than the heat treatment. The silicon film thus formed has an important feature that the energy band gap is 1.3 to 1.9 eV, which is different from that of a single crystal silicon film.

42 Claims, 19 Drawing Sheets

TFT Size: Pch 3/20
(L/W[um]): Nch 3/10

| POWER SUPPLY (V) | OSCILLATION FREQUENCY (MHz) | | |
|---|---|---|---|
| | 9 STAGES | 19 STAGES | 51 STAGES |
| 2.0 | 18.6 | 9.6 | 3.6 |
| 3.0 | 38.5 | 19.2 | 7.2 |
| 4.0 | 59.8 | 29.4 | 10.7 |
| 5.0 | 75.7 | 37.2 | 13.9 |
| 6.0 | 90.4 | 44.8 | 16.6 |
| 7.0 | 100.3 | 50.8 | 18.2 |
| 8.0 | 108.0 | 55.3 | 20.7 |
| 9.0 | 117.0 | 59.4 | 22.4 |
| 10.0 | 123.0 | 62.6 | 23.6 |

TFT Size: Pch 3/20
(L/W[um]): Nch 3/10

| POWER SUPPLY (V) | OSCILLATION FREQUENCY (MHz) | | |
|---|---|---|---|
| | 9 STAGES | 19 STAGES | 51 STAGES |
| 2.0 | 18.6 | 9.6 | 3.6 |
| 3.0 | 38.5 | 19.2 | 7.2 |
| 4.0 | 59.8 | 29.4 | 10.7 |
| 5.0 | 75.7 | 37.2 | 13.9 |
| 6.0 | 90.4 | 44.8 | 16.6 |
| 7.0 | 100.3 | 50.8 | 18.2 |
| 8.0 | 108.0 | 55.3 | 20.7 |
| 9.0 | 117.0 | 59.4 | 22.4 |
| 10.0 | 123.0 | 62.6 | 23.6 |

TFT Size: Pch 3/20
(L/W[um]): Nch 3/10

| POWER SUPPLY (V) | OSCILLATION FREQUENCY (MHz) | | |
|---|---|---|---|
| | 9 STAGES | 19 STAGES | 51 STAGES |
| 6.0 | 4.9 | 1.5 | 0.4 |
| 8.0 | 9.9 | 3.6 | 1.2 |
| 10.0 | 15.8 | 6.5 | 2.2 |
| 12.0 | 22.2 | 9.6 | 3.4 |
| 14.0 | 28.9 | 12.8 | 4.6 |
| 16.0 | 32.4 | 15.7 | 5.8 |
| 18.0 | 36.9 | 18.3 | 6.8 |

SEMICONDUCTOR THIN FILM AND SEMICONDUCTOR DEVICE

BACKGROUND OF THE INVENTION

1. Field of the Invention

The present invention relates to a semiconductor thin film formed on a substrate having an insulating surface and a semiconductor device formed by using such a semiconductor thin film. As for the semiconductor thin film, the invention particularly relates to a silicon film having crystallinity.

2. Description of the Related Art

The thin-film transistor (TFT) is typically known as the above-mentioned semiconductor device. A liquid crystal display device, an EL device, a CL device, and other devices can be constructed by using thin-film transistors.

A technique is known in which the active layer of a TFT is formed on a single crystal silicon film by using the SOI (silicon on insulator) technology. In view of the uniformity and the controllability, the thickness of the single crystal film needs to be 1 μm or more. The energy band gap (hereinafter referred to simply as Eg) of a silicon film formed by using the SOI technology is about 1.1 eV, which is approximately equal to the bulk Eg of a single crystal silicon film.

For example, consider a case where as shown in FIG. 2A the active layer of a TFT formed by using the SOI technology consists of conductive layers (n-type layers 201 or p-type layers 202) and an I layer (intrinsic semiconductor layer) that constitutes the channel. In this case, the energy band is curved at the junctions to equalize the Fermi levels (indicated by broken lines in FIG. 2A), so that an energy difference occurs between the I layer 203 and the conductive layers 201 and 202.

In this case, since the energy difference between the I layer 203 and the conductive layers 201 or 202 is as small as about 0.5 eV, for instance, carriers are allowed to move relatively easily even when no voltage is applied to the gate electrode (no electric field state).

That is, in a graph of FIG. 2A in which the horizontal and vertical axes represent the gate voltage (Vg) and the source-drain current (Id), respectively, the threshold voltage of an Id-Vg characteristic 204 of an n-channel TFT is shifted to the negative side and that of an Id-Vg characteristic 205 of a p-channel TFT is shifted to the positive side, to establish a normally-on state.

A TFT whose electrical characteristic is normally on is a depletion-type TFT. That is, the depletion-type TFT has a feature that it is always in an on-state. Conversely, a TFT that is always in an off-state (normally off) is called an enhancement-type TFT. However, for the above-described reason, when it is intended to form a channel-forming region by an intrinsic semiconductor in a SOI structure, a resulting TFT is necessarily a depletion type.

Therefore, in order to form an enhancement-type TFT, the threshold voltage is controlled by implanting, into a channel-forming region 208, an impurity for imparting p-type conductivity (for n-type conductive layers 206) or an impurity for imparting n-type conductivity (for p-type conductive layers 207) as shown in FIG. 2B.

As a result, as shown in FIG. 2B, the energy difference between the I layer 208 and the conductive layers 206 or 207 is increased to about 0.7 eV, for instance, to form sufficiently high barriers for carrier movement. That is, since the threshold voltage of an Id-Vg characteristic 209 of an n-channel TFT is shifted to the positive side and that of an Id-Vg characteristic 210 of a p-channel TFT is shifted to the negative side, it is possible to establish a normally-off state.

As described above, when an enhancement-type TFT is formed by using the SOI technology, the prior art has some demerits as exemplified by a fact that it is necessary to implant an impurity into a channel region, which means increase of an ion implantation step.

Further, it is known that when the active layer is thick, the characteristics of a TFT are likely deteriorated by the punch-through phenomenon, the short channel effect, etc. It is reported that in order to solve this problem it is effective to decrease the thickness of the active layer. To this end, however, the thickness needs to be 500 Å or less; it is very difficult to attain such a thin active layer by the SOI technology, as described above.

SUMMARY OF THE INVENTION

An object of the present invention is to solve the above problems by forming a semiconductor thin film whose crystallinity is equivalent to that of a single crystal by a method other than the SOI technology.

Another object of the invention is to provide a technique capable of forming a high-performance semiconductor device having superior electrical characteristics by using the above semiconductor thin film.

According to one aspect of the invention, there is provided a semiconductor thin film formed on an insulating substrate, the semiconductor thin film being a silicon film having a region that can substantially be regarded as a single crystal, the silicon film having an energy band gap of 1.3 to 1.9 eV at the room temperature. The thickness of the silicon film is in a range of 100 to 850 Å.

For the reasons described below, an active layer formed by using the above semiconductor thin film has such superior performance that the problems of the SOI technology which were described in the background section can be solved.

First, a silicon film having crystallinity (crystalline silicon film) according to the invention can be formed as a thin film of 100 to 850 Å in thickness. A crystalline silicon film may be formed by crystallizing an amorphous silicon film or may directly be formed on a substrate.

Capable of forming a region that can substantially be regarded as a single crystal in a silicon thin film of 100 to 850 Å in thickness, the invention can suppress the punch-through phenomenon and the short channel effect which result from a large thickness and are problematic with the SOI technology.

The region that can substantially be regarded as a single crystal means a region having no barriers that obstruct movement of carriers, in other words, a region including substantially no grain boundaries.

An important feature of the invention is that attention is paid to the energy band gap Eg of a silicon film. The feature that Eg is in the range of 1.3 to 1.9 eV, preferably 1.4 to 1.7 eV, at the room temperature (10° to 30° C.) provides the following advantages.

As shown in FIG. 1A, a case is assumed in which the active layer of a TFT according to the invention consists of conductive layers (n-type layers 101 or p-type layers 102) and a channel-forming I layer (intrinsic semiconductor layer) 103. It is also assumed that Eg of a silicon film is 1.3 to 1.9 eV, for instance, 1.4 eV, which is different from Eg shown in the conventional case of FIG. 2A.

In this case, an energy difference between the I layer 103 and the conductive layers 101 and 102 amounts to 0.7 eV, for instance, which is larger than that obtained when the SOI technology is used as described in the background section. Therefore, carrier movement is not effected when there is no electric field. That is, a TFT securing a normally-off state can be realized even if the channel-forming region is an I layer (intrinsic semiconductor layer). According to knowledge of the inventors, this effect can be obtained if Eg is 1.3 eV or more, preferably 1.4 eV or more.

The energy band gap Eg as used above is defined as a value obtained by determining a wavelength dependence of the effective transmittance of a silicon film by measuring an optical absorption spectrum thereof and then converting, into an energy value E, an absorption edge wavelength $\lambda$ at which the effective transmittance starts to decrease according to an equation $E=hc/\lambda$ where h is Planck's constant and c is the speed of light.

According to another aspect of the invention, there is provided a semiconductor device formed on an insulating substrate, comprising a semiconductor thin film as an active layer of the semiconductor device, the semiconductor thin film being a silicon film having a region that can substantially be regarded as a single crystal, the silicon film having an energy band gap of 1.3 to 1.9 eV at the room temperature.

FIG. 1B shows a general structure of the above semiconductor device. Although a detailed description of the semiconductor device will be described in preferred embodiments, it should be noted that the thickness of the active layer is in a range of 100 to 850 Å. Although naturally the semiconductor device can be formed by using an even thicker active layer, it is preferable that the thickness be 500 Å or less.

The active layer has a structure in which a channel-forming region is interposed between n-type or p-type regions 104 and 105 as source and drain regions. The semiconductor device according to the invention has a feature of much superior electrical characteristics because a silicon thin film whose crystallinity is equivalent to that of a single crystal is formed at a thickness of 100 to 850 Å.

Since the I layer 106 as the channel-forming region has an energy band gap Eg of 1.3 to 1.9 eV which is larger than that of a single crystal silicon film, a normally-off thin-film transistor can be formed without threshold voltage control which is needed with the conventional SOI technology.

DETAILED DESCRIPTION OF THE PREFERRED EMBODIMENTS

The present invention as summarized above will be hereinafter described in detail by way of several illustrated embodiments.

Embodiment 1

A method of forming a semiconductor thin film whose crystallinity is equivalent to that of a single crystal and its properties will be described in this embodiment. More specifically, a description will be made of knowledge of a crystalline silicon film superior in crystallinity which the inventors have acquired so far.

It is noted that the inventors have already disclosed a method of forming a semiconductor thin film whose crystallinity is equivalent to that of a single crystal (see Japanese Unexamined Patent Publication No. Hei. 6-64834). The method of this embodiment adds another value to the above technique by adding a thermal oxidation step of a relatively high temperature, whereby the crystallinity is further improved.

Figure 1A:
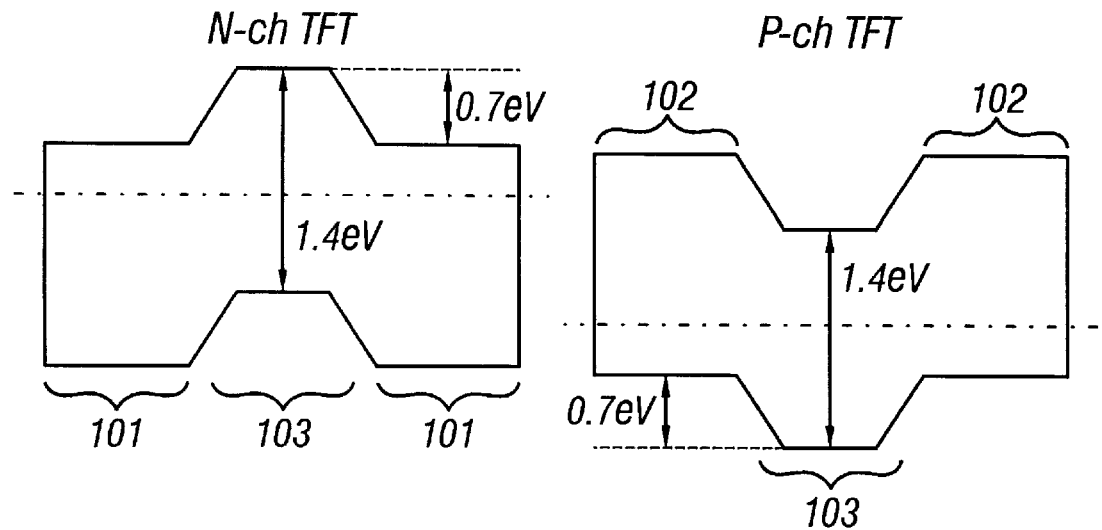
FIGS. 1A and 1B illustrate features of the present invention.
Figure 1B:
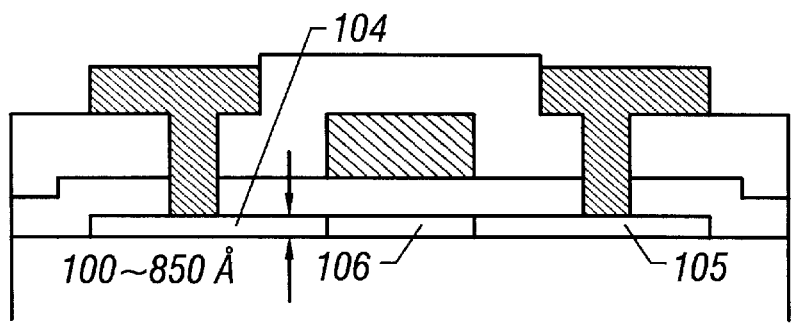
Figure 2A:
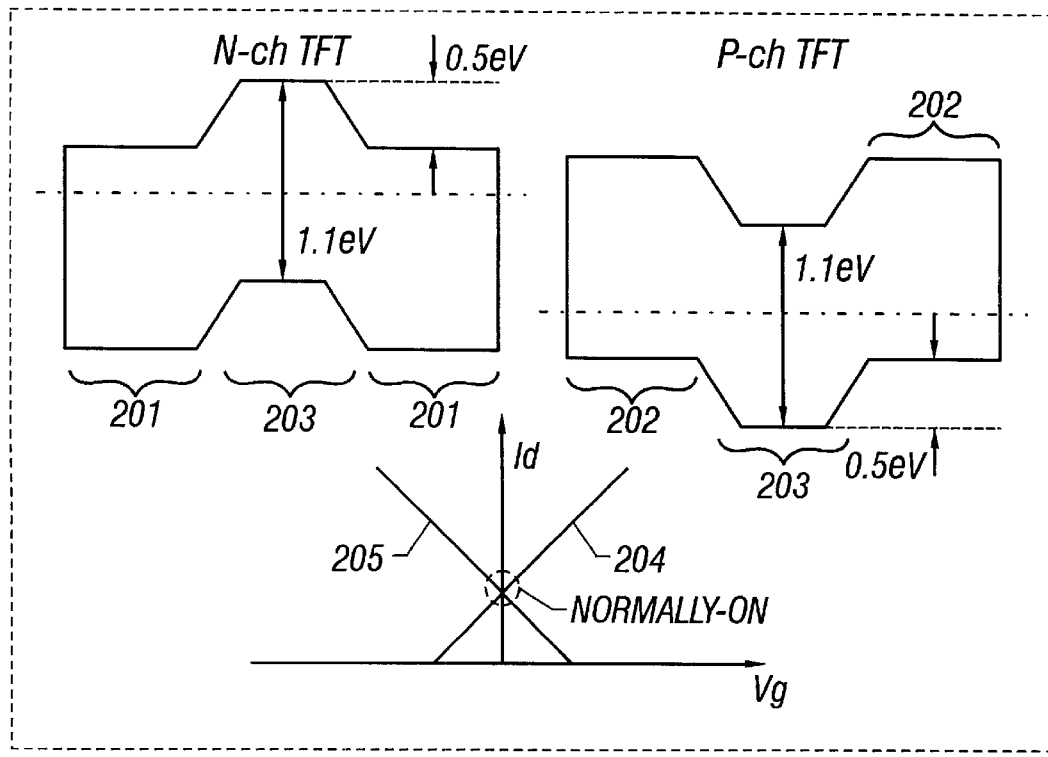
FIGS. 2A and 2B illustrate energy band states of conventional active layers.
Figure 2B:
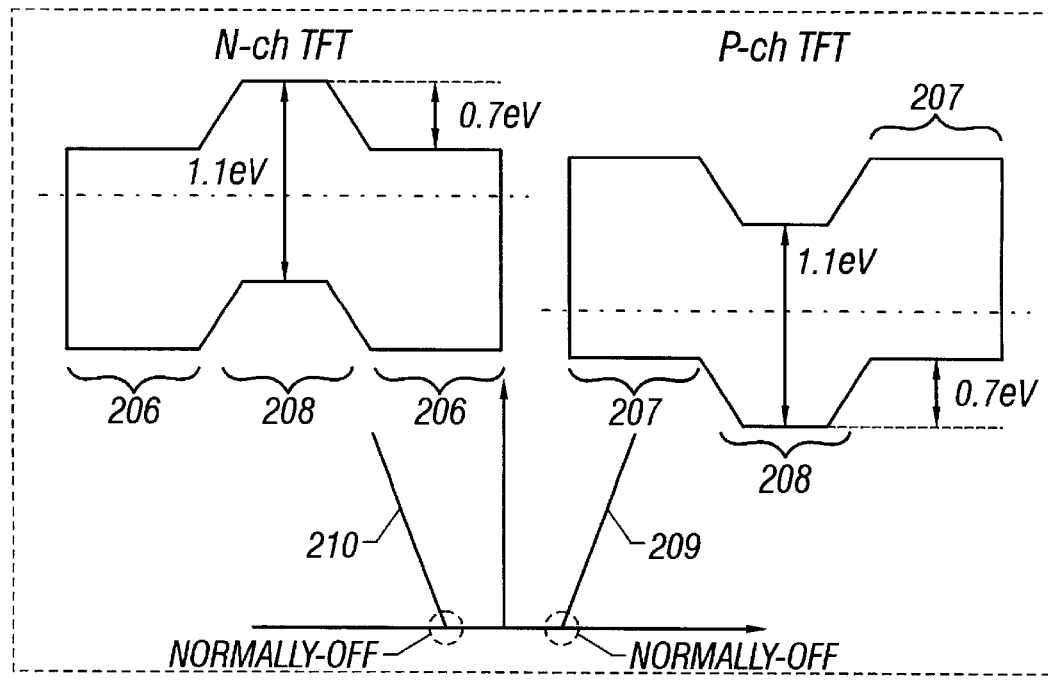
Figure 3A:
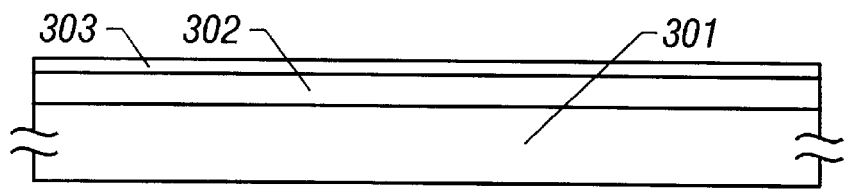
FIGS. 3A to 3D show a process for forming a crystalline silicon film according to a first embodiment of the invention.

First, a process for forming a semiconductor thin film will be described with reference to FIGS. 3A to 3D. Referring to FIG. 3A, reference numeral 301 denotes a substrate having an insulating surface. In view of heating in a later crystallization step, it is preferable to use, for instance, a quartz substrate which is superior in heat resistance. A silicon oxide film as an undercoat film 302 is formed on the quartz substrate 301.

Then, a 1,000-Å-thick amorphous silicon film 303 is formed by low-pressure thermal CVD. It is preferable that the amorphous silicon film 303 be so formed as to be thicker than a desired thickness in consideration of the fact that the thickness will decrease in a later thermal oxidation step.

Thus, the state of FIG. 3A is obtained. Then, the amorphous silicon film 303 is crystallized by a heat treatment or laser annealing, or a combination of those.

In this embodiment, crystallization is performed by the techniques disclosed in Japanese Unexamined Patent Publication Nos. Hei. 6-232059 and Hei. 7-321339. In these techniques, a silicon film superior in crystallinity is obtained by performing a heat treatment at 500° C. to 700° C. (typically 600° C. to 650° C.) for 1 to 24 hours (typically 4 to 12 hours) with a metal element (for instance, nickel) held adjacent to an amorphous silicon film.

First, in the state of FIG. 3A, a thin oxide film (not shown) is formed on the surface of the amorphous silicon film 303 with UV light. This oxide film is formed to improve the wettability of the film surface for a nickel salt solution applied in the following step.

Figure 3B:
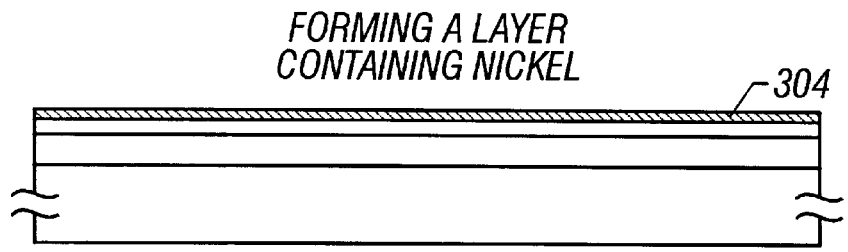

Then, a nickel acetate salt solution that has been so adjusted as to contain the element of nickel at 10 ppm in terms of weight is dropped onto the oxide film (not shown), and a thin nickel-containing layer 204 is formed by spin coating (see FIG. 3B).

Figure 3C:
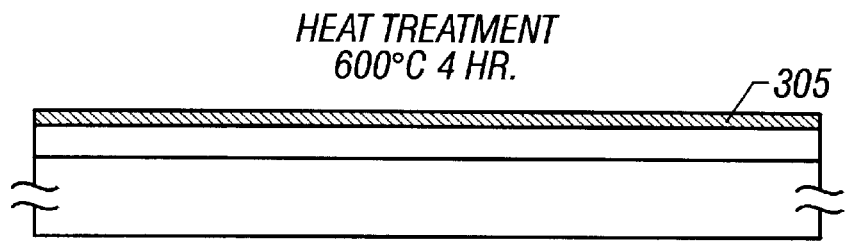

In the state of FIG. 3B, a heat treatment is performed to crystallize the amorphous silicon film 303 into a crystalline silicon film 305 (see FIG. 3C). In this embodiment, the heat treatment is performed at 600° C. for 4 hours.

The crystallinity of the resulting crystalline silicon film 305 is superior to that of a crystalline silicon film obtained without using the techniques of the above-mentioned publications. According to the knowledge of the inventors, the crystallinity can further be improved by performing laser annealing after the crystallization by the heat treatment.

However, in the invention, a heat treatment is performed at a relatively high temperature as a means for further improving the crystallinity. Specifically, a thermal oxidation treatment is performed at 800° C. to 1,000° C., preferably 950° C., for 30 minutes in an oxidizing atmosphere containing chlorine at 3% with respect to oxygen.

Figure 3D:

A resulting crystalline silicon film 306 has large crystal grains each of which has much superior crystallinity, which is substantially equivalent to that of a single crystal (see FIG. 3D). The inventors call this grain region a monodomain region. Although not shown in FIG. 3D, a 500-Å-thick thermal oxidation film is formed on the crystalline silicon film 306.

It is expected that the above thermal oxidation treatment gives the following effects on the crystalline silicon film 305:

(1) elimination of metal elements (such as nickel) from the inside and the surface of the silicon film;

(2) improvement of crystallinity by elimination of crystal defects etc.; and (3) reduction in the thickness of the silicon film.

Item (1) is due to the gettering effect of chlorine that is contained in the heat treatment atmosphere, and contributes to elimination of crystal defects such as lattice distortions and dislocations caused by the existence of metal elements. Item (2) is due to a phenomenon that the heat treatment at a relatively high temperature causes rearrangement of silicon atoms and improve coordination of silicon. As for item (3), the reduction in the thickness of the silicon film provides various advantages such as suppression of the short channel effect.

By examining the crystalline silicon film 306 thus obtained, the inventors have found the following facts.

Figure 4:
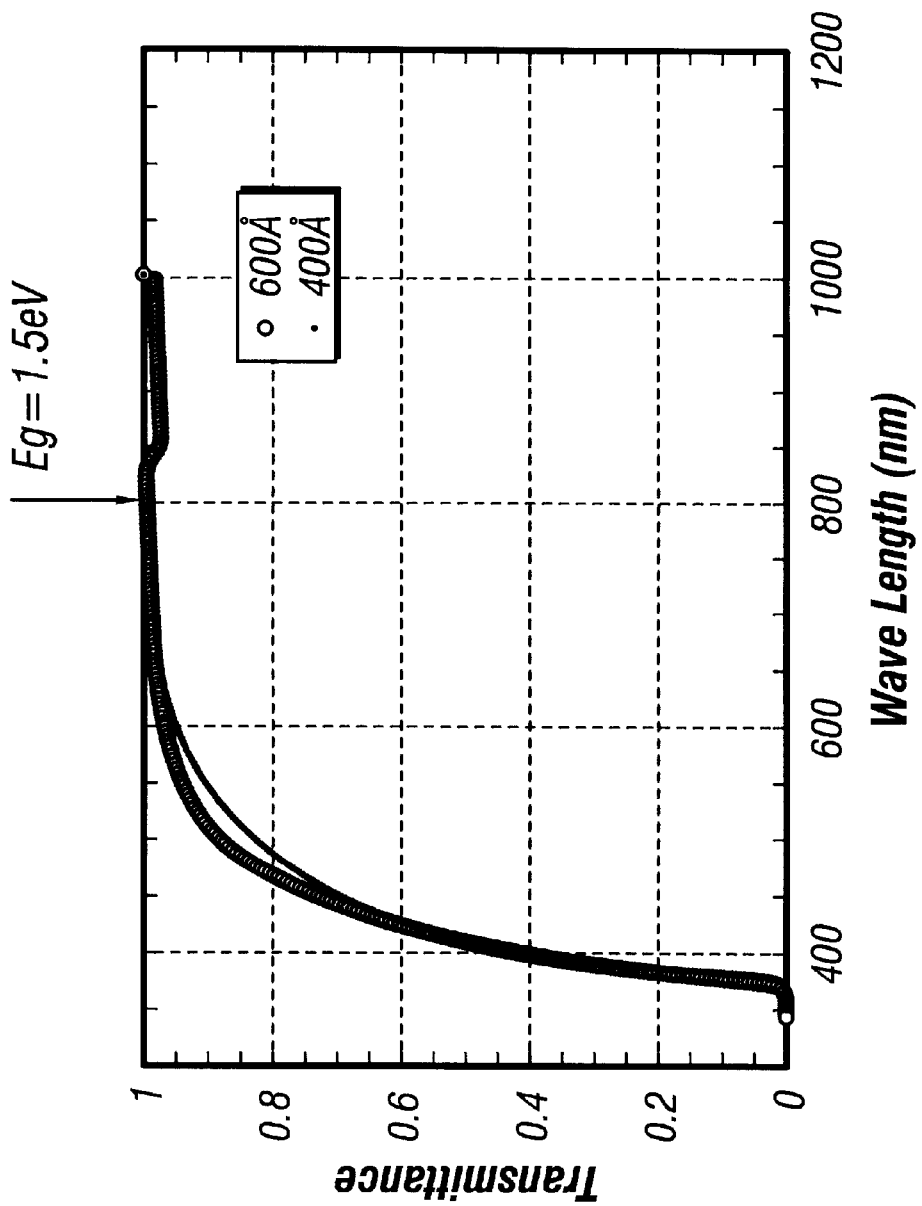
FIG. 4 is a graph showing absorption spectra of the crystalline silicon film formed by the process of FIGS. 3A to 3D.

FIG. 4 is a graph showing data of an experiment in which optical absorption spectra of samples of the crystalline silicon film 306 formed by the process of this embodiment were measured. In FIG. 4, the horizontal axis represents the wavelength in the visible range and the vertical axis represents the effective transmittance that is the ratio between light intensities before and after transmission through the film, i.e., the transmittance calculated without a light component reflected by the film surface. The silicon film samples were 400 Å and 600 Å in thickness.

The inventors thought that there should occur energy loss corresponding to the energy band gap (Eg) of the silicon film when light passes through the silicon film, and presumed that light in a wavelength range where the energy is higher than Eg cannot pass through the silicon film, resulting in a reduction in transmittance. In other words, it is expected that light having a wavelength at which the transmittance starts to fall has an energy just corresponds to Eg of the silicon film.

As seen from FIG. 4, the transmittance starts to fall at a wavelength of about 800 nm, from which Eg is calculated as about 1.5 eV. This calculation is derived from Einstein's equation of photon energy, Eg=hc/λ where h is Planck's constant, c is the speed of light, and λ is the wavelength of light.

It is concluded that the crystalline silicon film 306 formed according to this embodiment has Eg of about 1.5 eV and only light having a wavelength range longer than the wavelength corresponding to Eg can easily pass through the silicon film 306.

The important feature of the invention is that attention is paid to Eg of a crystalline silicon film that can substantially be regarded as a single crystal, as described above. If Eg is equal to 1.3 eV (as described above, a silicon film having this value can provide a normally-off TFT even if the active layer is thin), a corresponding wavelength is calculated as about 950 nm according to the above-mentioned photon energy equation. In view of this, the inventors have defined that the invention is effective in a wavelength range of 800±150 nm, and the upper limit of Eg of the invention is set at 1.9 eV (corresponding to wavelength 650 nm).

In summary, although the crystalline silicon film according to the invention can substantially be regarded as a single crystal, it is different from a single crystal in that its Eg (=1.3 to 1.9 eV) is larger than Eg (=1.1 eV) of a single crystal silicon film. To realize a normally-off TFT for certain and minimize the threshold voltage, it is preferable that Eg be in a range of 1.4 to 1.7 eV.

Thus, it can be said that the invention is advantageous over the conventional SOI technology in forming, on an insulating substrate, a silicon film whose crystallinity is equivalent to that of a single crystal, and hence the invention will greatly contribute to the semiconductor industry.

Embodiment 2

In this embodiment, a process for forming a thin-film transistor by using, as the active layer, a semiconductor thin film whose crystallinity is equivalent to that of a single crystal and which is formed according to the first embodiment will be described with reference to FIGS. 5A to 5E. This embodiment merely describes an example process and the structure and the numerical values of the invention are not limited to those of this embodiment.

First, a 2,000-Å-thick insulating film as an undercoat film 502 is formed on an insulating substrate 501. In this embodiment, a quartz substrate is used as the substrate 501 and as the insulating film a film of silicon oxide ($SiO_2$), silicon oxynitride ($SiO_xN_y$), silicon nitride (SiN), or the like is formed by plasma CVD, low-pressure thermal CVD, sputtering, etc.

Figure 5A:
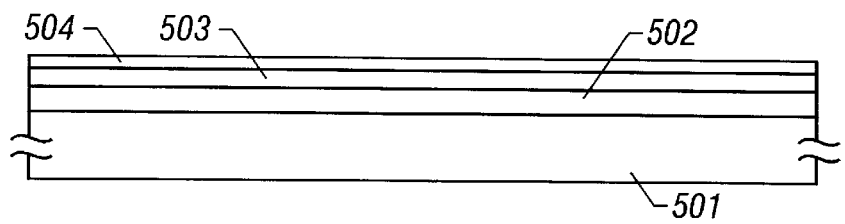
FIGS. 5A to 5E show a manufacturing process of a thin-film transistor according to a second embodiment of the invention.

A crystalline silicon film 503 having a region (monodomain region) that can substantially be regarded as a single crystal is formed on the undercoat film 502 according to the first embodiment. This step is not described here because it was described in detail in the first embodiment. Thus, the state of FIG. 5A is obtained.

Reference numeral 504 denotes a 500-Å-thick thermal oxidation film that was formed by a thermal oxidation treatment of 950° C. and 30 minutes. Therefore, at this time point the silicon film 503 is made thinner by its portion that has turned into the thermal oxidation film 504 (about 250 Å).

Then, after the thermal oxidation film 504 is removed, the crystalline silicon film 503 is patterned into an island-like semiconductor layer (not shown) which will become a starting layer of an active layer. In this state, a heat treatment (i.e., a thermal oxidation step) is again performed in an oxidizing atmosphere containing chlorine under the same conditions as in the first embodiment.

As a result of the heat treatment, a 500-Å-thick thermal oxidation film 505 which will serve as a gate insulating film is formed on the surface of the island-like semiconductor layer (not shown) and, at the same time, an active layer 506 is defined. The final thickness of the active layer 506 is reduced to 500 Å as a result of the two thermal oxidation steps so far conducted.

Although in this embodiment only the thermal oxidation film 505 is used as the gate insulating film, a gate insulating film of a multilayered structure may be formed by laying another insulting film such as a silicon oxide film or a silicon nitride film on the thermal oxidation film 505.

As a further alternative, a gate insulating film of a silicon oxide film or a silicon nitride film is formed first to cover the active layer 505, followed by a heat treatment in an oxidizing atmosphere containing chlorine. This is advantageous in that a very good $Si/SiO_2$ interface can be formed because thermal oxidation occurs on the active layer surface under the gate insulating film. Naturally it is expected that the film quality of the gate insulating film is improved.

Subsequently, a conductive coating (not shown) is formed at a thickness of 2,000 to 2,500 Å. In this embodiment, an aluminum film containing scandium at 0.2 wt % is formed. Scandium has an effect of preventing hillocks and whiskers that would otherwise be formed on the aluminum surface in a heat treatment or the like.

In this state, the aluminum film is anodized in an electrolyte, which is obtained by neutralizing (pH=6.92) an ethylene glycol solution of 3%-tartaric acid with aqueous ammonia. Platinum is used as the cathode, and the formation current and the final voltage are set at 5 mA and 10 V, respectively.

A resulting thin, dense anodic oxide film (not shown) has an effect of improving the adhesiveness with a photoresist when the aluminum film (not shown) will be patterned. The thickness of the anodic oxide film can be controlled by controlling the voltage application time.

Figure 5B:
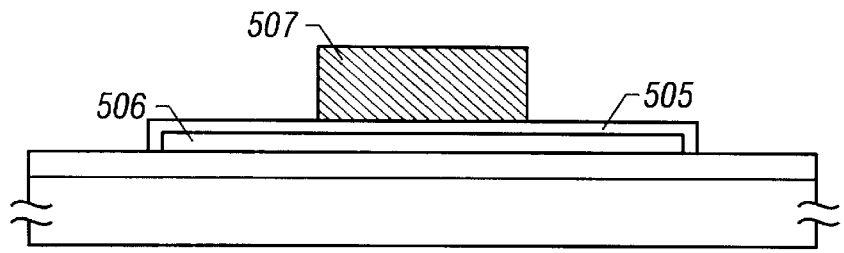

Then, the aluminum film (not shown) is patterned into an aluminum film pattern 507 which is a starting layer of a gate electrode. Thus, the state of FIG. 5B is obtained.

Figure 5C:
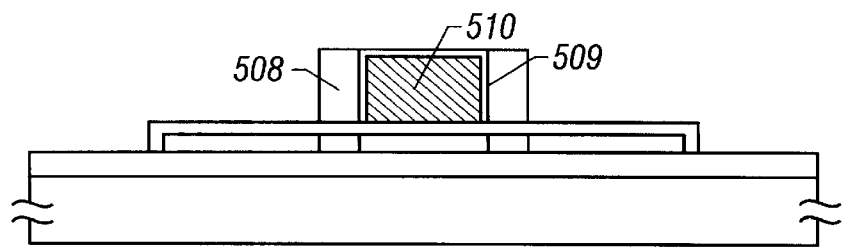

Thereafter, second anodization is performed as shown in FIG. 5C, to form a porous anodic oxide film 508. An electrolyte is a 3%-aqueous solution of oxalic acid. Platinum is used as the cathode, and the formation current and the final voltage are set at 2 to 3 mA and 8 V, respectively. At this time, anodization proceeds in parallel direction with the substrate because the resist mask (not shown) that was used for the patterning remains on the pattern 507. The length of the porous anodic oxide film 508 can be controlled by controlling the voltage application time.

Then, after the resist film (not shown) that was used for the patterning of the aluminum film is removed with a dedicated peeling liquid, third anodization is performed in an electrolyte, which is obtained by neutralizing (pH=6.92) an ethylene glycol solution of 3%-tartaric acid with aqueous ammonia. Platinum is used as the cathode, and the formation current and the final voltage are set at 5 to 6 mA and 40 to 100 V, respectively.

A resulting anodic oxide film 509 is very dense and strong, and hence has an effect of protecting a gate electrode 510 from heat and from being damaged in ensuing steps such as doping steps. The thickness of the anodic oxide film 509 is 500 to 1,500 Å. Thus, the state of FIG. 5C is obtained.

Subsequently, an impurity is implanted into the active layer 506 by ion doping. For example, P (phosphorus) ions may be implanted as the impurity to form an n-channel TFT, and B (boron) ions may be implanted as the impurity to form a p-channel TFT.

The ion implantation is performed in two steps. The first ion implantation is performed in the state of FIG. 5C. In this ion implantation step, regions 511 and 512 which will become the source and the drain are formed in a self-aligned manner with the porous anodic oxide film 508 etc. serving as a mask.

After the porous anodic oxide film 508 is removed, the second doping is performed. In this ion implantation step, low-concentration impurity regions 513 and 514 which have a lower impurity concentration than the source region 511 and the drain region 512 are formed in a self-aligned manner with the gate electrode 510 serving as a mask. A channel-forming region 515 is formed in a self-aligned manner in a region right under the gate electrode 307 no impurity is implanted into that region.

In particular, the low-concentration impurity region 514 thus formed is called a LDD region, and has an effect of preventing a strong electric field from being formed between the channel-forming region 515 and the drain region 512. To be strict, offset regions corresponding to the thickness of the dense anodic oxide film 509 are formed between the channel-forming region 515 and the low-concent ration impurity regions 513 and 514. However, the offset regions have substantially no effect when they are as narrow as less than 1,000 Å.

Subsequently, the implanted impurity ions are activated by irradiation with KrF excimer laser light at an energy density of 200 to 300 $mJ/cm^2$. Alternatively, the activation may be performed by thermal annealing of 300° C. to 450° C. and 2 hours or a combination of laser annealing and thermal annealing.

Figure 5D:
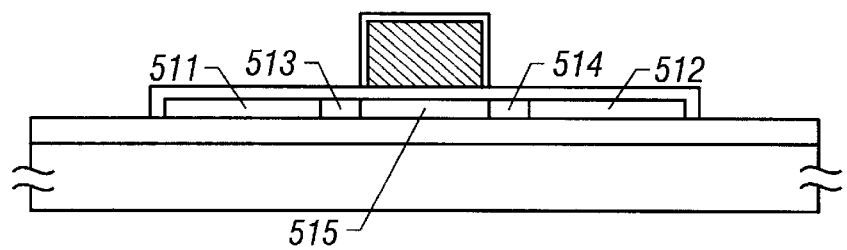

The state of FIG. 5D is obtained through the above-described implantation and activation of impurity ions. Then, an interlayer insulating film 516 is formed by plasma CVD. The interlayer insulating film 516 may be a silicon oxide film, a silicon oxynitride film, a silicon nitride film, or the like. The thickness of the interlayer insulating film may be set at 0.5 to 1.0 µm.

The interlayer insulating film 516 may be made of an organic resin material as typified by polyimide or acryl. A coating, even a thick one, of such an organic resin material can be formed easily. Further, such an organic resin material can realize a surface that is superior in flatness by reducing the degree of asperity due to a device shape.

After the formation of the first interlayer insulating film 516, contact holes are formed through the source region 511 and the drain region 512 and then a 3,000-Å-thick aluminum film (not shown) is formed. The aluminum film (not shown) is then patterned into a source electrode 517 and a drain electrode 518.

Finally, a heat treatment is performed at about 350° C. and for about one hour in a hydrogen atmosphere as a hydrogen treatment for terminating dangling bonds (hydrogenation of a semiconductor device). Thus, a semiconductor device having the structure of FIG. 5E is completed.

Figure 5E:
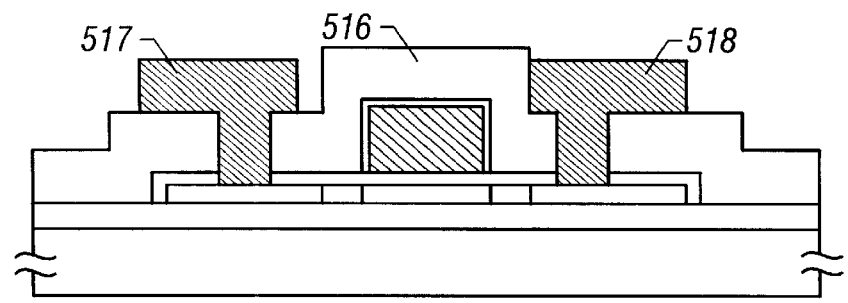

The semiconductor device shown in FIG. 5E according to the invention has a much superior switching function because the active layer is substantially a single crystal silicon film and has Eg of 1.3 to 1.9 eV, which is larger than the bulk Eg of a single crystal silicon film. Further, the active layer is very thin (100 to 850 521 ), deteriorations in the characteristics of the semiconductor device due to the punch-through phenomenon, the short-channel effect, etc. can be suppressed.

Figure 6A:
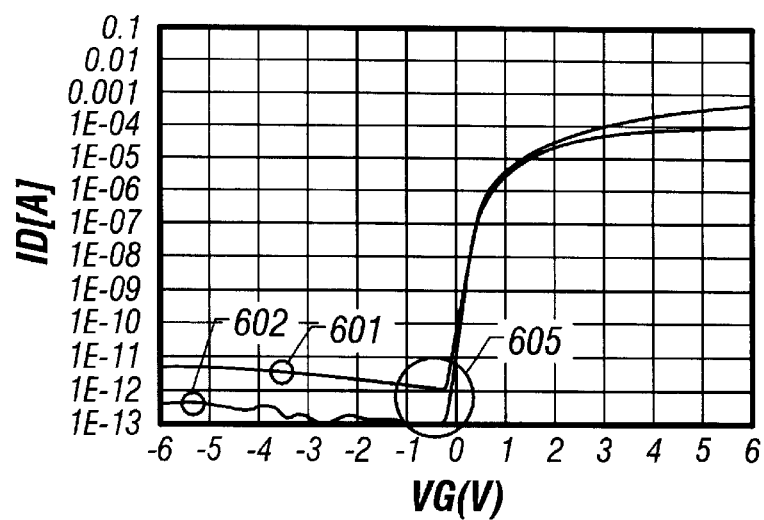
FIGS. 6A and 6B are graphs showing electrical characteristics of a thin-film transistor of FIG. 5E.
Figure 6B:
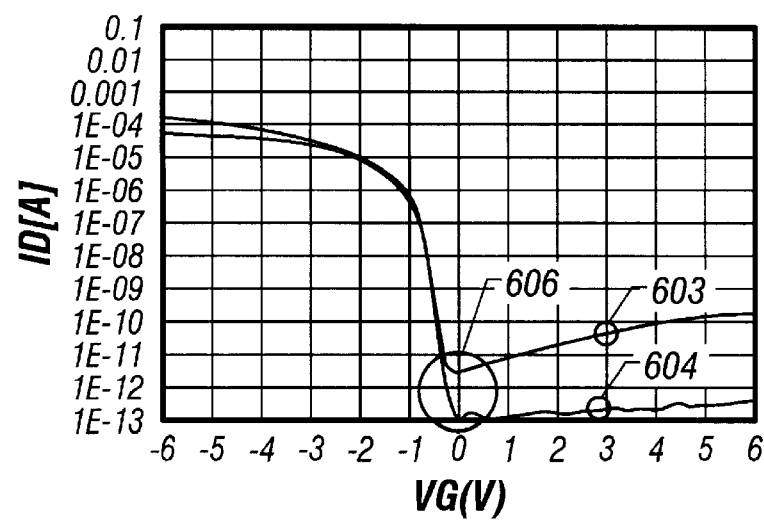

FIGS. 6A and 6B show electrical characteristics of samples of the semiconductor device shown in FIG. 5E which were produced by the inventors according to this embodiment. FIG. 6A shows an electrical characteristic (Id-Vg characteristic) of an n-channel TFT and FIG. 6B shows that of a p-channel TFT. The horizontal axis (VG) represents the gate voltage and the vertical axis (ID) represents the source-drain current. Id-Vg curves 601 and 603 represent characteristics when the drain voltage VD=1 V, and Id-Vg curves 602 and 604 represent characteristics when VD=5 V.

First, attention should be paid to very small shifts in threshold voltage. Reference numerals 605 and 606 denote regions where the source-drain current ID rises. In the region 605, both curves 601 and 602 of the n-channel TFT rise at VG=−0.5 V. That is, almost no current flows when the gate voltage VG=0 V, which means that a normally-off state is established.

Similarly, in the region 606, both curves 603 and 604 of the p-channel TFT rise at VG=0 to −0.5 V. It is apparent that a normally-off state is established.

Table 1 shows typical characteristic parameters of the TFTs which have been obtained from FIGS. 6A and 6B. Each parameter value is one calculated by averaging measurement values at 40 points and its variation is shown as a standard deviation σ. It is noted the samples were such that each of the channel length L and width W was 8 μm and the thickness $T_{OX}$ of the gate insulating film was 560 Å.

TABLE 1

| | | Ion (μm) | Ioff (μm) | Vth (V) | S-value (V/dec) | μFE (cm²/Vs) |
|---|---|---|---|---|---|---|
| n-channel TFT | Average | 86 | 0.03 | −0.25 | 0.08 | 200 |
| | Standard deviation δ | 13.2 | 0.07 | 0.16 | 0.01 | 31.9 |
| p-channel TFT | Average | 36 | 1.65 | −1.36 | 0.08 | 160 |
| | Standard deviation δ | 4.7 | 2.57 | 0.18 | 0.01 | 15.4 |

Although the values of Table 1 are based on measurement data of VD=1 V, the off-current Ioff is very small, i.e., 0.03 pA in the case of the n-channel TFT and 1.65 pA in the case of the p-channel TFT. The small off-current values indicate that these TFTs are superior in terms of the function of a switching element as well as exhibit small power consumption. Further, the threshold voltage Vth is small, i.e., −0.25 V in the case of the n-channel TFT and −1.36 V in the case of the p-channel TFT, which show that a normally-off state is obtained with almost no problems.

The subthreshold value (S-value) and the electric field-effect mobility (μFE) show that the semiconductor device according to the invention has an active layer that is substantially a single crystal. The S-value is 80 mV/dec in each of the n-channel and p-channel TFTs, and μFE is 200 cm²/V.s in the n-channel TFT and 160 cm²/V.s in the p-channel TFT. These values evidence that the thin-film transistor of the invention has much superior characteristics, and clearly indicate the advantages of the invention.

Actually there were TFT samples which exhibited S values of about 60 mV/dec, which is almost equal to the S-value of a single crystal silicon film. Providing a very small S-value is another feature of the semiconductor thin film according to the invention. It can be said that this feature is defined such that the S-value is 85 mV/dec or less, preferably 75 mV/dec or less.

In obtaining an Id-Vg curve, the inventors perform highly accurate measurements by varying the gate voltage VG in a range of −3 V to 3 V with fine width of variation steps. This will be described below by using the S-value measurement as an example.

FIGS. 16A to 16H show Id-Vg curves (electrical characteristics) with four different variation steps of the gate voltage VG. FIGS. 16A to 16D show curves of an n-channel TFT sample and FIGS. 16E to 16H show curves of a p-channel TFT sample.

Figure 16A:
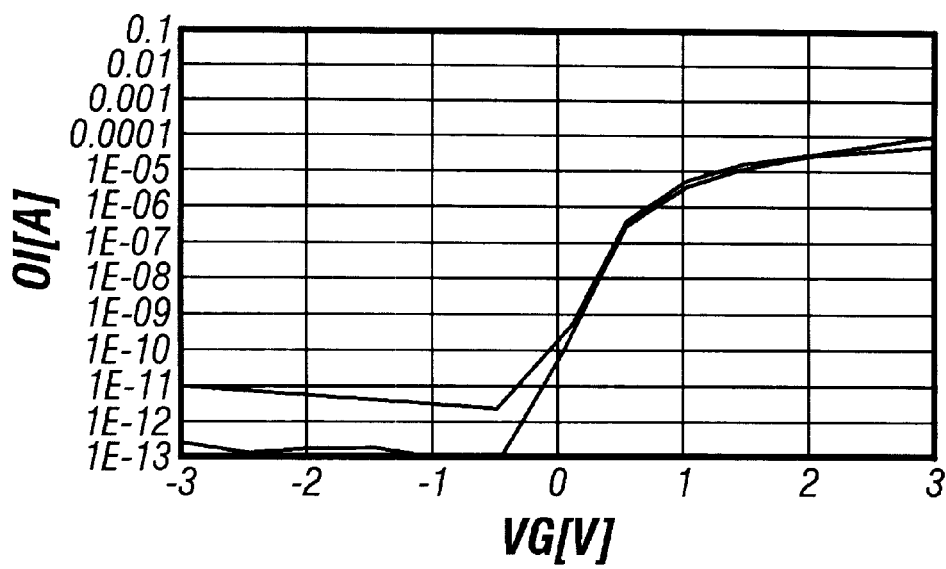
FIGS. 16A to 16H are graphs showing electrical characteristics is of the thin-film transistor of FIG. 5E.
Figure 16B:
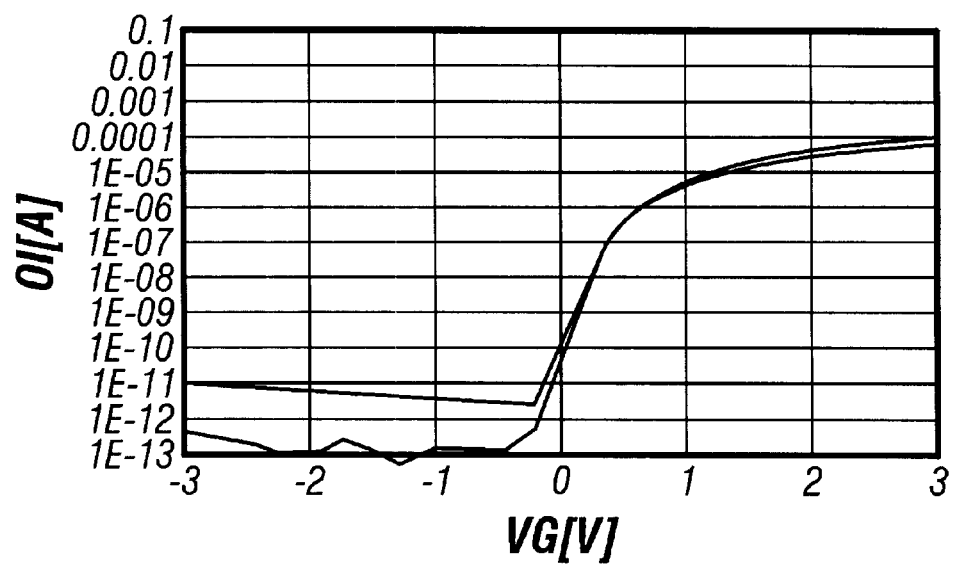
Figure 16C:
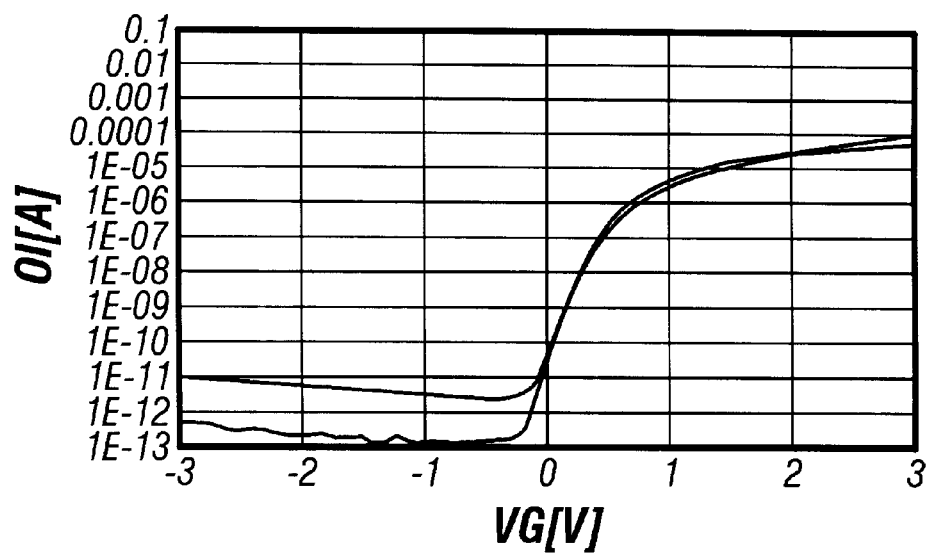
Figure 16D:
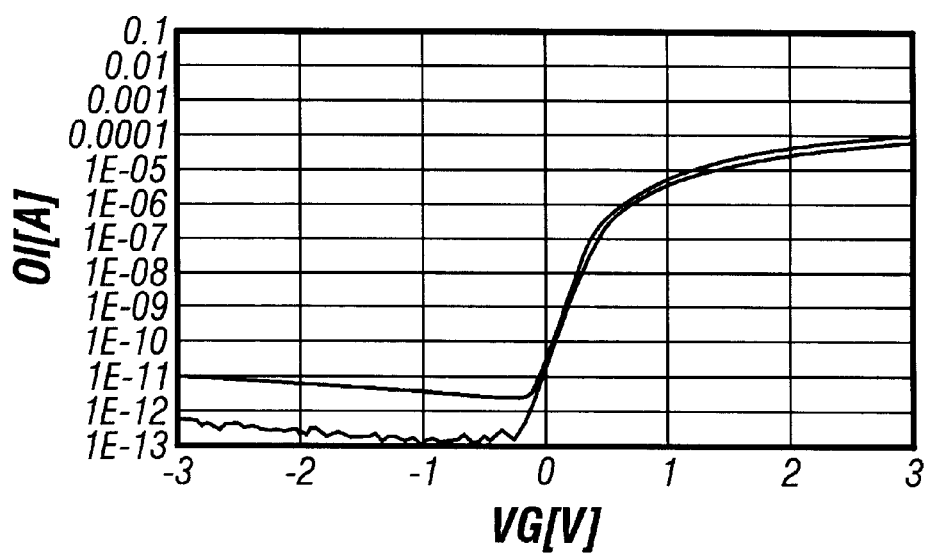
Figure 16E:
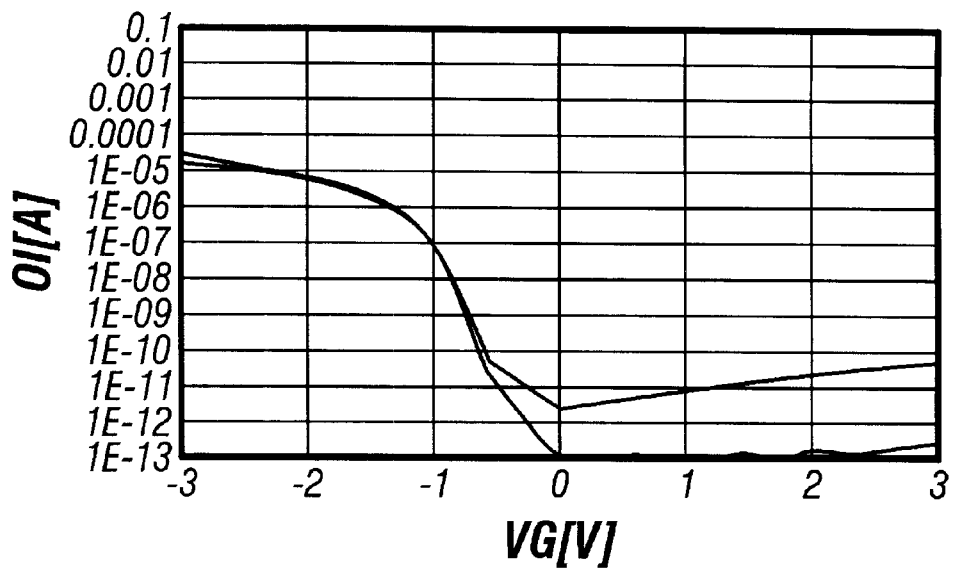
Figure 16F:
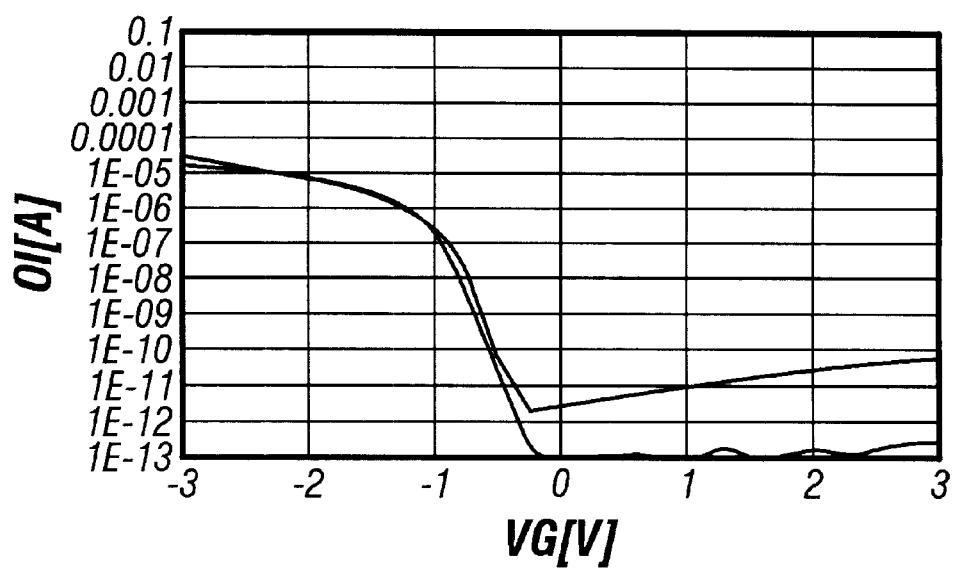
Figure 16G:
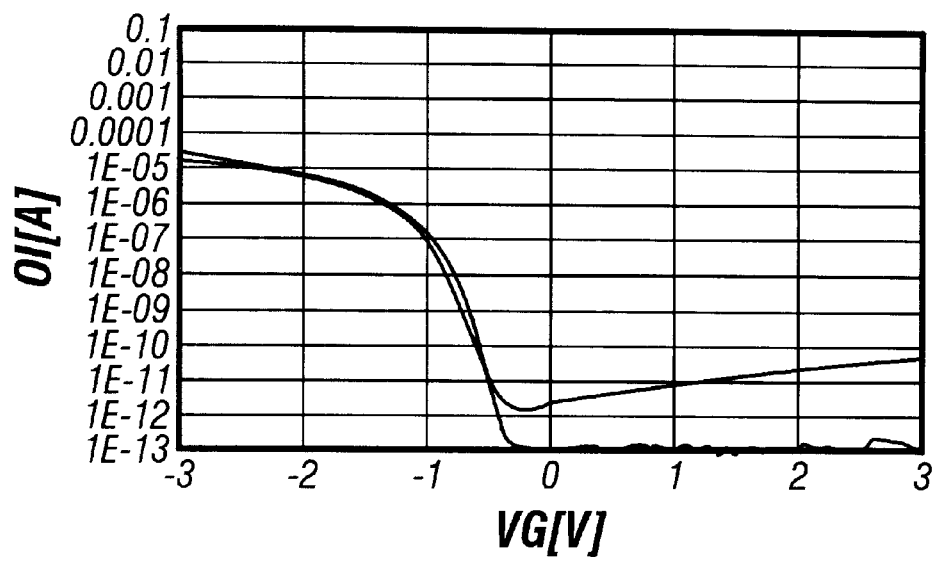

In FIG. 16A, width of the variation step is 0.5 V and the S-value is calculated as 139 mV/dec. Because of the large variation step, each of the Id-Vg curves is like a connection of straight lines. As width of the VG variation step is decreased in order of 0.25 V (FIG. 16B), 0.1 V (FIG. 16C), and 0.05 V (FIG. 16D), the Id-Vg curves become smoother and the S-value becomes smaller. In the case of FIG. 16D (variation step width: 0.05 V), the S-value is 83 mV/dec.

Figure 16H:
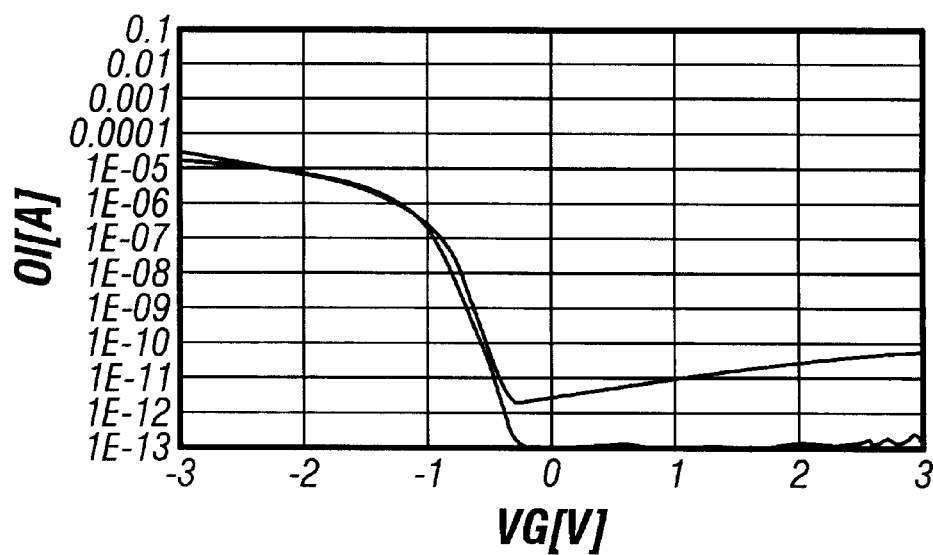

The same thing applies to the case of the p-channel TFT. As width of the variation step is decreased, the S-value becomes smaller: 162 mV/dec (FIG. 16E), 84 mV/dec (FIG. 16F), 76 mV/dec (FIG. 16G), and 74 mV/dec (FIG. 16H).

In this manner, an accurate measurement can be performed by making the VG variation step finer. Electrical characteristics used in the specification are those obtained by such highly accurate measurements.

One of the features of the invention is that the S-value as obtained by a highly accurate measurement as described above is 85 mV/dec or less. The S-value 85 mV/dec is very close to an S-value (about 60 mV/dec) that is obtained when an ordinary single crystal silicon film is used, and evidences that the crystallinity of the silicon film according to the invention is much superior.

A consideration will be given why the S-value can be made smaller. This consideration is an attempted by regarding the silicon film of the invention as a single crystal film and using equations obtained by analyzing the semiconductor properties of a single crystal silicon film. Therefore, the inventors think that the following discussions do not apply to an ordinary polysilicon film or amorphous silicon film.

According to the law of mass action, the intrinsic carrier concentration $n_i$ in the channel-forming region is $n_i=(N_cN_v)^{1/2}e^{-Eg/2kT}$ where Nc is the effective state density in the conduction band, Nv is the effective state density in the valence band, Eg is the energy band gap, k is the Boltzmann constant, and T is the absolute temperature.

It is understood from the above equation that the intrinsic carrier density ni decreases as Eg increases. The silicon film according to the invention has the feature that although it is substantially a single crystal film, Eg is as large as 1.3 to 1.9 eV. Therefore, it is considered that the silicon film of the invention has a smaller intrinsic carrier density $n_i$ than a single crystal.

The width Xd of a depletion layer that is formed when a gate voltage is applied is expressed as $Xd=(2\epsilon_s\epsilon_0\phi_s/qn_i)^{1/2}$ where $\epsilon_s$ is the relative dielectric constant, $\epsilon_0$ is the vacuum dielectric constant, $\phi_s$ is the surface potential of silicon, and q is the charge of a carrier. If $\phi_s$ exceeds a certain value, the depletion layer width Xd does not increase any further. With attention paid to this time point, it is known from the above equation that the depletion layer width Xd is larger if the intrinsic carrier density ni is smaller.

This means that the depletion layer capacitance Cd is smaller, as is understood from the fact that Cd is calculated by the equation $Cd=\epsilon_s\epsilon_0/Xd$. It is known that the depletion layer capacitance Cd is one of the parameters that greatly influence the S-value.

In general, the S-value is defined as a variation of Vg necessary for one-order variation of Id, and is expressed as $S=\ln10(kT/q)\{1+(Cd+Cit)/Cox\}$ where Cit is the equivalent capacitance of interface states and Cox is the gate capacitance. Since the semiconductor device of this embodiment realizes a Si/SiO$_2$ interface that is superior in matching performance by using a thermal oxidation film as a gate insulating film (i.e., the level of interface states is very low), the term of Cit can be disregarded.

With an assumption that Cox=constant, it is understood from the above equation that the S-values decreases as the depletion layer capacitance Cd decreases. Therefore, the S-value becomes a minimum value when the depletion layer capacitance Cd becomes negligibly small (Cd=0). The S-value in this state is considered the S-value of single crystal silicon in the ideal state (i.e., the ideal S-value).

Actually, it is said that the ideal S-value of single crystal silicon is about 60 mV/dec. Although S-values of samples of the semiconductor device according to this embodiment generally fell within a range of 60 to 85 mV/dec, there were some samples which exhibited S-values of 60 mV/dec or less. This type of phenomenon is sometimes reported also in the case of using the SOI technology.

The inventors consider the above phenomenon as follows. According to the above theoretical discussions, the S-value should decrease as the energy band gap Eg increase (with the assumption that the silicon film can be regarded as a single crystal film). Actually, however, the semiconductor device of this embodiment has an S-value that is larger than the ideal S-value.

For the following reason, this is considered due to the fact that the active layer of the semiconductor device of this embodiment is as thin as 500 Å. The depletion layer width Xd increases as the gate voltage is increased. However, once the depletion layer width Xd reaches 500 Å, the depletion layer cannot expand any more being limited by the film thickness. In this case, since the depletion layer capacitance Cd does not decrease any more, the S-value is also limited.

The above reasoning is an explanation as to why the invention enables formation of the thin-film transistor having much superior electrical characteristics as shown in FIGS. 6A and 6B.

In the above discussions, the depletion layer capacitance Cd is correlated with the S-value with the assumption that the gate capacitance Cox is constant. Actually, however the gate capacitance Cox varies with the thickness Tox of the gate insulating film. In view of this, the inventors conducted an simulation on the relationship between the depletion layer capacitance Cd and the S-value for three values, 100 Å, 250 Å, and 500 Å, of the thickness Tox of the gate insulating film.

Substituting Cit=0 into the above-mentioned equation of the S-value, we obtain S=ln10(kT/q)(1+Cd/Cox). At 300 K (room temperature), ln10(kT/q)=0.06. Therefore, we obtain Cd=(S/0.06−1)Cox.

In the equation of the gate capacitance Cox=$\epsilon_r\epsilon_0$S/Tox, $\epsilon_r$=3.8, $\epsilon_0$=8.85×10$^{-14}$ F/cm, and S=6.4×10$^{-7}$ cm$^2$ (the area of the channel-forming region is calculated with the assumption that each of the channel length L and the channel width W is 8 μm). Thus, the gate capacitance Cox is calculated as follows for the three values, 100 Å, 250 Å, and 500 Å, of the thickness Tox of the gate insulating film:

When Tox=100 Å, Cox=3.36×10$^{-7}$ F/cm$^2$.
When Tox=250 Å, Cox=1.35×10$^{-7}$ F/cm$^2$.
When Tox=500 Å, Cox=6.73×10$^{-8}$ F/cm$^2$.

Substituting the above value of Cox (Tox=100 Å) into the above-obtained equation Cd=(S/0.06−1)Cox, we obtain $$Cd_{100}=5.60\times10^{-6}S_{100}-3.36\times10^{-7} [F/cm^2]$$

where $Cd_{100}$ and $S_{100}$ are a value of Cd and an S-value when Tox=100 Å. Similarly, depletion layer capacitances $Cd_{250}$ (Tox=250 Å) and $Cd_{500}$ (Tox=500 Å) are $$Cd_{250}=2.25\times10^{-6}S_{250}-1.35\times10^{-7}[F/cm^2]$$

$$Cd_{500}=1.12\times10^{-6}S_{500}-6.73\times10^{-8}[F/cm^2].$$

Figure 17:
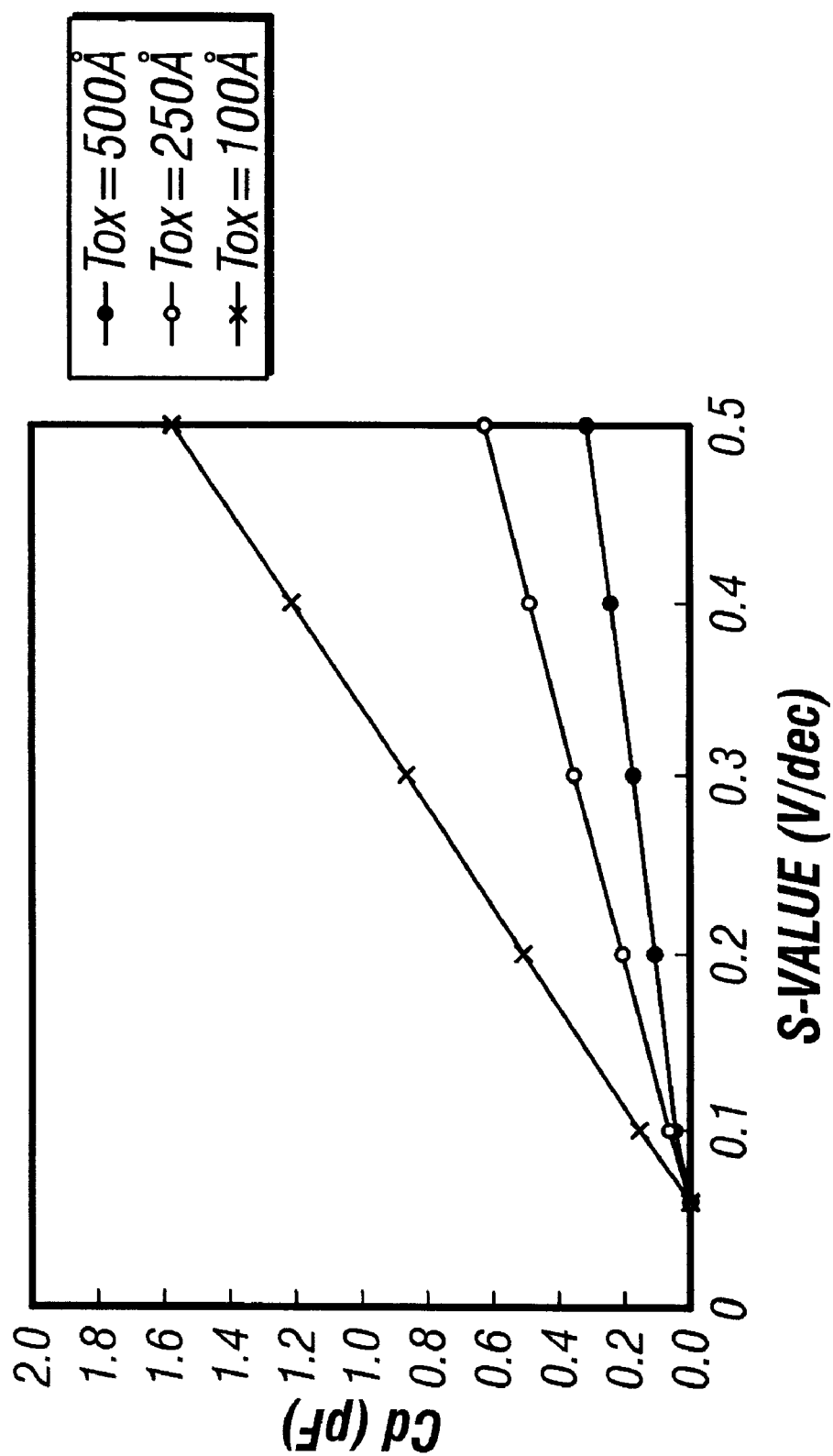
FIG. 17 is a graph showing relationships between the depletion layer capacitance and the S-value.

FIG. 17 shows results of a simulation in which values of Cd for arbitrary S-values are calculated. The horizontal axis represents the S value and the vertical axis represents the depletion layer capacitance Cd. As seen from FIG. 17, the S-value becomes the ideal S-value (=0.06 V/dec) when the depletion layer capacitance Cd is equal to 0.

It is also seen from FIG. 17 that the depletion layer capacitance Cd increases as the thickness Tox of the gate insulating film becomes smaller. Further, the gate insulating film having a larger thickness Tox provides a straight line having a gentler slope, that is, it is presumed that the S-value is more sensitive to a variation in Cd. Since it is presumed that in the invention the S-value is improved by making Cd smaller, it is preferable that the thickness Tox of the gate insulating film be 500 Å or more at least.

Embodiment 3

As described in the second embodiment, the semiconductor device according to the invention has the features that the S-value is small and the mobility is large, and is therefore very effective when used in constructing a circuit that is required to operate at high speed. For example, in an active matrix display device having a pixel matrix circuit and peripheral driver circuits on the same substrate, high-speed operation is required in shift registers etc. used in the peripheral driver circuits.

Such driver circuits are usually constructed as CMOS circuits in which n-channel TFTs and p-channel TFTs are combined complementarily. In view of this, this embodiment is directed to a case of forming a CMOS structure by TFTs according to the second embodiment. FIGS. 7A to 7E, 8A to 8D, and 9A to 9B show a manufacturing process according to this embodiment. It is noted that the crystalline silicon film according to the invention has a wide application range and that the method for forming a CMOS structure is not limited to that of this embodiment.

First, according to the first embodiment, a silicon oxide film 702 is formed on a glass substrate 701 and a crystalline silicon film having a monodomain region is formed thereon. The crystalline silicon film is patterned into an active layer 703 of an n-channel TFT and an active layer 704 of a p-channel TFT each of which is constituted only of a monodomain region.

In this state, a thermal oxidation step is performed as described in the second embodiment to form thermal oxidation films 705 which will serve as gate insulating films. The thickness of the thermal oxidation films 705 can be controlled by the processing temperature and time. In this embodiment, the thickness if set at 500 Å as in the cases of the first and second embodiments.

Figure 7A:
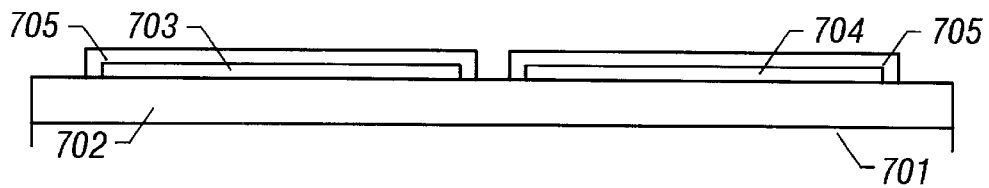
FIGS. 7A to 7E, 8A to 8D, and 9A to 9B show a manufacturing process according to a third embodiment of the invention.
Figure 7B:
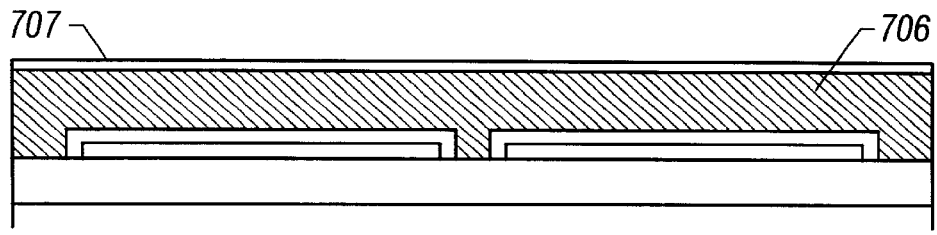

Thus, the state of FIG. 7A is obtained. In this state, an aluminum film 706 which will constitute gate electrodes are formed as shown in FIG. 7B. To prevent hillocks and whiskers, the aluminum film 706 is caused to contain scandium at 0.2 wt %. The aluminum film 706 is formed by sputtering or electron beam evaporation.

Hillocks and whiskers, which are prickle or needle-like protrusions caused by abnormal growth of aluminum, may cause short-circuiting or crosstalk between adjacent wiring lines or vertically separated wiring lines.

In addition to aluminum, metals such as tantalum and molybdenum that can be anodized may be used. It is also possible to use a silicon film that is given conductivity.

After the formation of the aluminum film 706, a thin, dense anodic oxide film 707 is formed by performing anodization is an electrolyte with the aluminum film 706 used as the anode (see FIG. 7B). The conditions of the anodization may be the same as in the second embodiment.

Figure 7C:
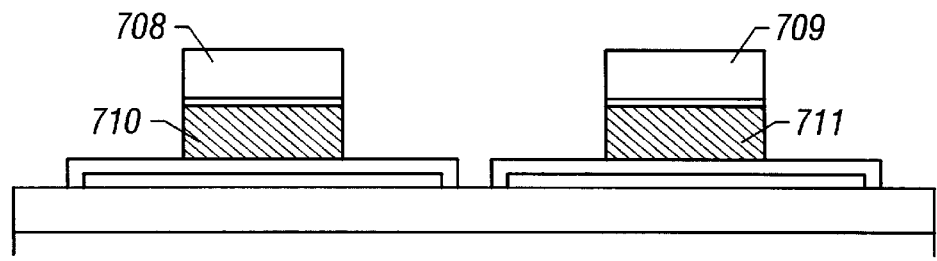

Then, resist masks 708 and 709 are formed. By using the resist masks 708 and 709, the aluminum film 706 is patterned into aluminum film patterns 710 and 711 which are starting layers of gate electrodes. Thus, the state of FIG. 7C is obtained.

Figure 7D:
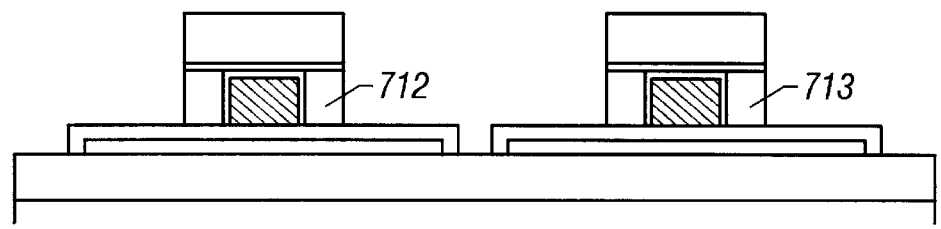

Subsequently, porous anodic oxide films 712 and 713 are formed on the side faces of the aluminum film patterns 710 and 711 under the same conditions as in the second embodiment. In this embodiment, the thickness of the porous anodic oxide films 712 and 713 is set at 0.7 Åm. Thus, the state of FIG. 7D is obtained.

Figure 7E:
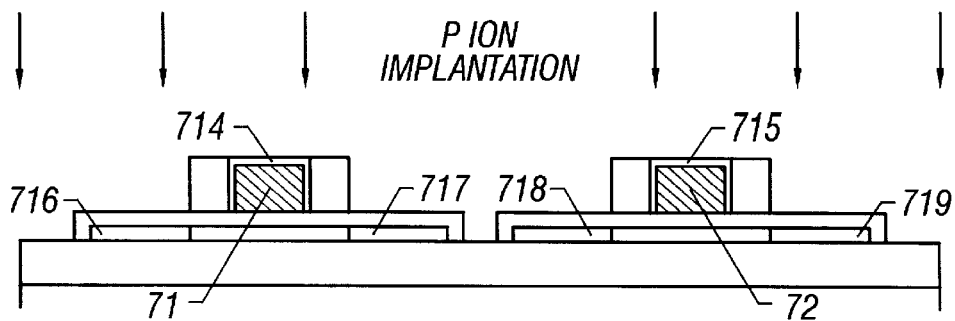

Then, dense, strong anodic oxide films 714 and 715 are formed under the same conditions as in the second embodiment with an exception that in this embodiment the final voltage is controlled so that the thickness of the anodic oxide films 714 and 715 become 700 Å. Gate electrodes 71 and 72 are defined by this step. FIG. 7E shows a gate resulting structure.

Thereafter, as shown in FIG. 7E, P (phosphorus) ions as an impurity for imparting n-type conductivity are applied to the entire structure. The doping is performed at a high dose of 0.2 to $5 \times 10^{15}$ cm$^{-2}$, preferably 1 to $2 \times 10^{15}$ cm$^{-2}$. The doping method may be plasma doping or ion doping.

As a result of the doping, regions 716 to 719 are formed in which P ions have been implanted at a high concentration. The regions 716 to 719 will serve as source regions and drain regions (see FIG. 7E).

Then, the porous anodic oxide films 712 and 713 are removed by using a solution of a mixed acid of acetic acid, nitric acid, and phosphoric acid. It is noted that parts of the active layers that located right under the anodic oxide films 712 and 713 are substantially intrinsic because no ions are implanted there.

Figure 8A:
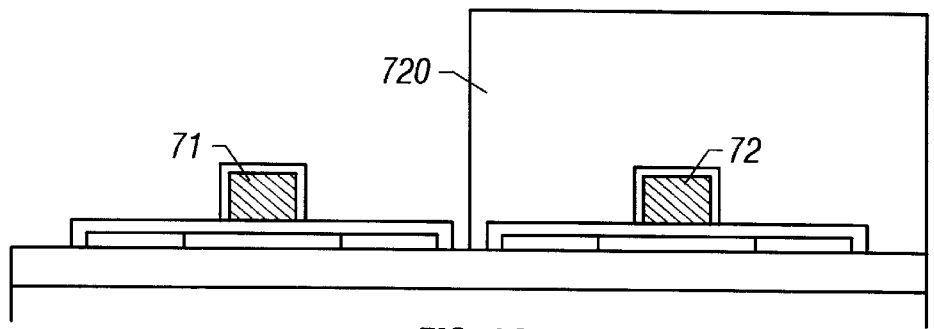

Subsequently, a resist mask 720 is so formed as to cover the right-hand structure which will become a p-channel TFT. Thus, the state of FIG. 8A is obtained. In this state, P ions are again implanted as shown in FIG. 8B at a low dose of 0.1 to $5 \times 10^{14}$ cm$^{-2}$, preferably 0.3 to $1 \times 10^{14}$ cm$^{-2}$.

Figure 8B:
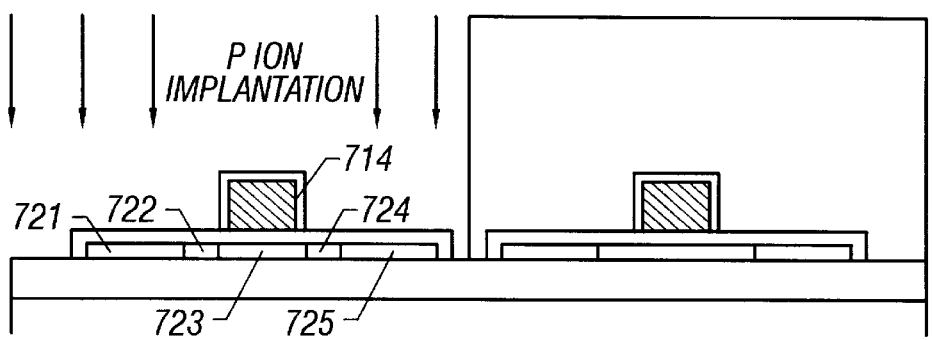

That is, the dose of the P ion implantation performed in the step of FIG. 8B is lower than that of the P ion implantation performed in the step FIG. 7E. As a result, low-concentration (lightly doped) impurity regions 722 and 724 are formed. Also formed are high-concentration impurity regions 721 and 725 in which P ions are implanted at a high concentration.

That is, this doping step produces a source region 721 of an n-channel TFT, the low-concentration impurity regions 722 and 724, a drain region 725, and a substantially intrinsic channel-forming region 723. The region 724 is Generally called a LDD (lightly doped drain) region.

Although not shown in any figures, regions that were shielded from ion implantation by the anodic oxide film 714 exist between the channel-forming region 723 and the low-concentration impurity regions 722 and 724. The length of these regions, which are called offset gate regions, corresponds to the thickness of the anodic oxide film 714.

Although the offset gate regions are substantially intrinsic because no ions are implanted there, no channel is formed there because a gate voltage is not applied thereto. Instead, the offset regions serve as resistance components that reduce the strength of electric fields and suppress deteriorations of the TFTs. However, where the length (offset width) of those regions are short, they do not serve as offset regions. They do not serve as offset regions in this embodiment, because the length is 700 Å.

Figure 8C:
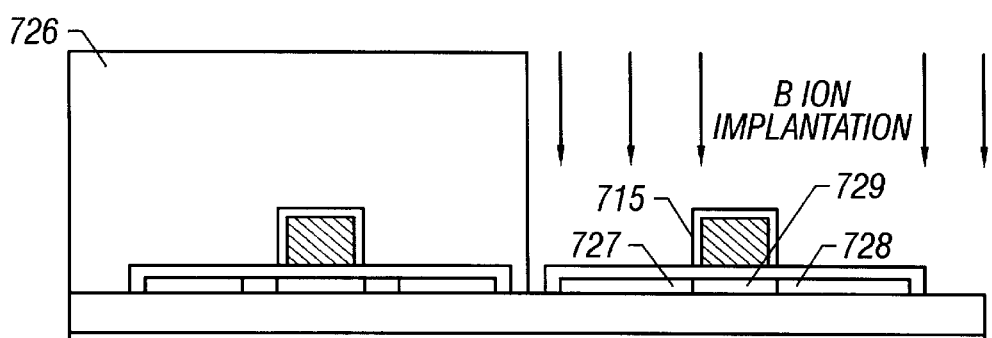

Then, after the resist mask 720 is removed, a resist mask 726 is so formed as to cover the left-hand n-channel TFT as shown in FIG. 8C. Then, as shown in FIG. 8C, B (boron) ions as an impurity for imparting p-type conductivity are implanted at a dose of 0.2 to $10 \times 10^{15}$ cm$^{-2}$, preferably 1 to $2 \times 10^{15}$ cm$^{-2}$. This dose may be at the same level as that in the step of FIG. 7E.

As a result of this doping step, the conductivity type of the high-concentration impurity regions 718 and 719 is changed from the n type to the p type, to form a source region 727 and a drain region 728 of the p-channel TFT. A channel-forming region 729 is formed right under the gate electrode 72.

Figure 8D:
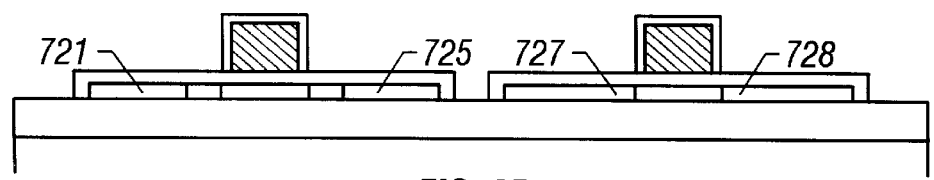

After completion of the step of FIG. 8C, the resist mask 726 is removed. Thus, the state of FIG. 8D is obtained. In this state, laser light is applied to activate the implanted impurities and anneal the regions where impurity ions are implanted.

Figure 9A:
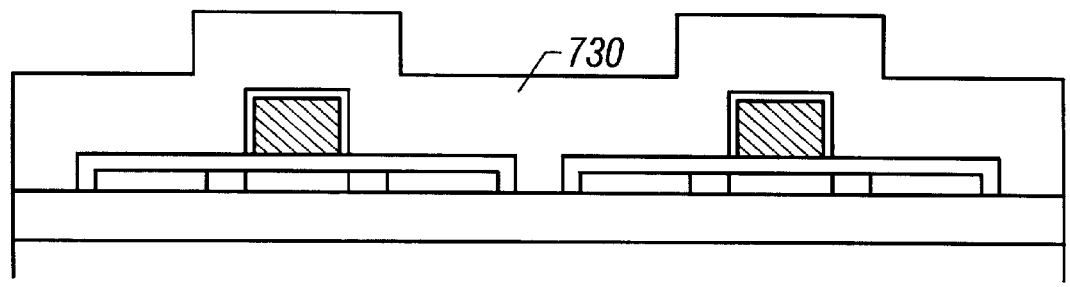
Figure 9B:
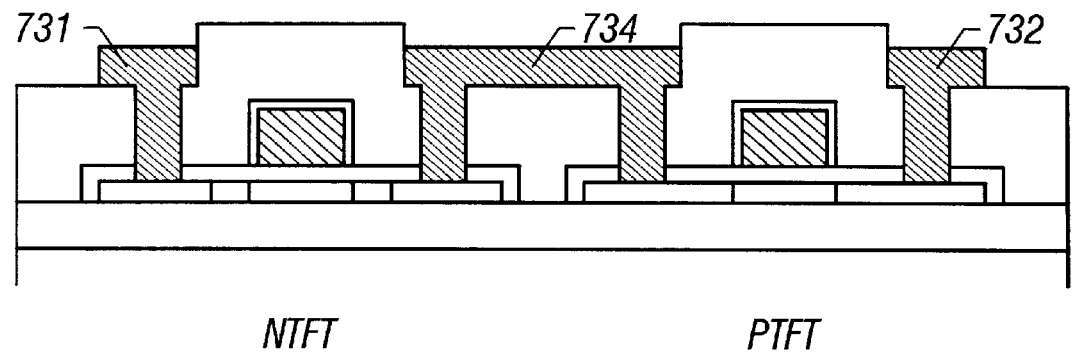

In the state of FIG. 8D, a 4,000-Å-thick interlayer insulating film 730 is formed as shown in FIG. 9A. The interlayer insulating film 730 may be any of a silicon oxide film, a silicon oxynitride film, and a silicon nitride film, or may even have a multilayered structure. Any of these silicon films may be formed by plasma CVD or thermal CVD.

Then, after contact holes are formed, a source electrode 731 of the n-channel TFT (NTFT) and a source electrode 732 of the p-channel TFT (PTFT) are formed. A drain electrode 733 is shared by the n-channel and p-channel TFT, to realize a CMOS structure (see FIG. 8B).

A CMOS circuit having the structure of FIG. 8B can be formed through the above-described process. A closed circuit formed by connecting together an odd number of CMOS circuits is called a ring oscillator, and used in evaluating the operation speed of a semiconductor device.

Figure 10:
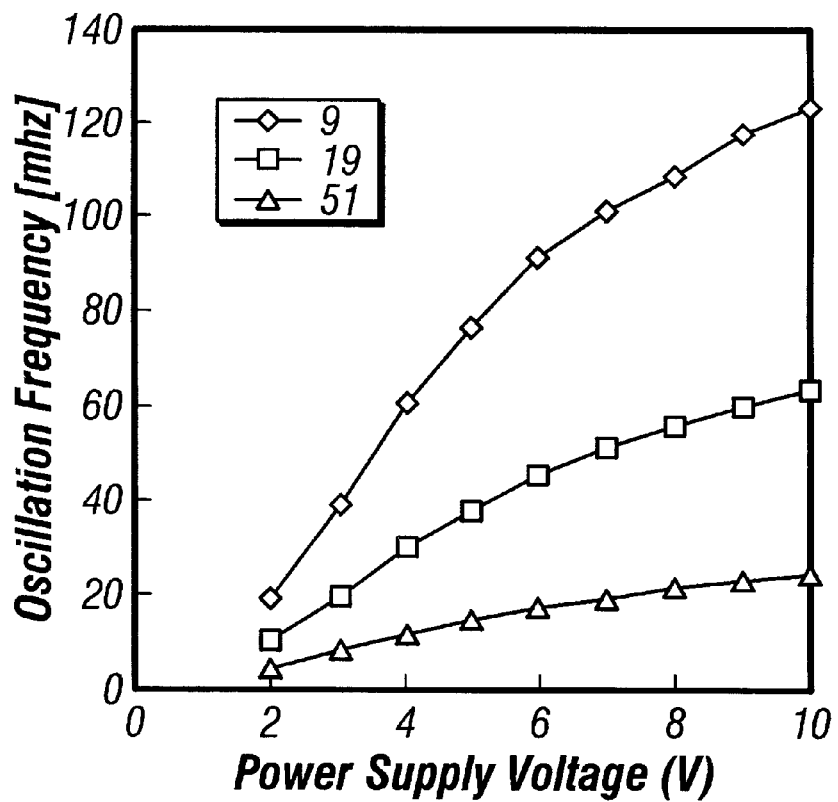
FIG. 10 shows measurement results of ring oscillators using the f the present invention TFTs in the third embodiment.

FIG. 10 shows results of an experiment in which ring oscillators were constructed by using CMOS circuits that were formed according to this embodiment and their oscillation frequencies are checked. Measurements were conducted on ring oscillators of 9, 19, and 51 stages to determine relationships between the power supply voltage and the oscillation frequency.

Figure 11:
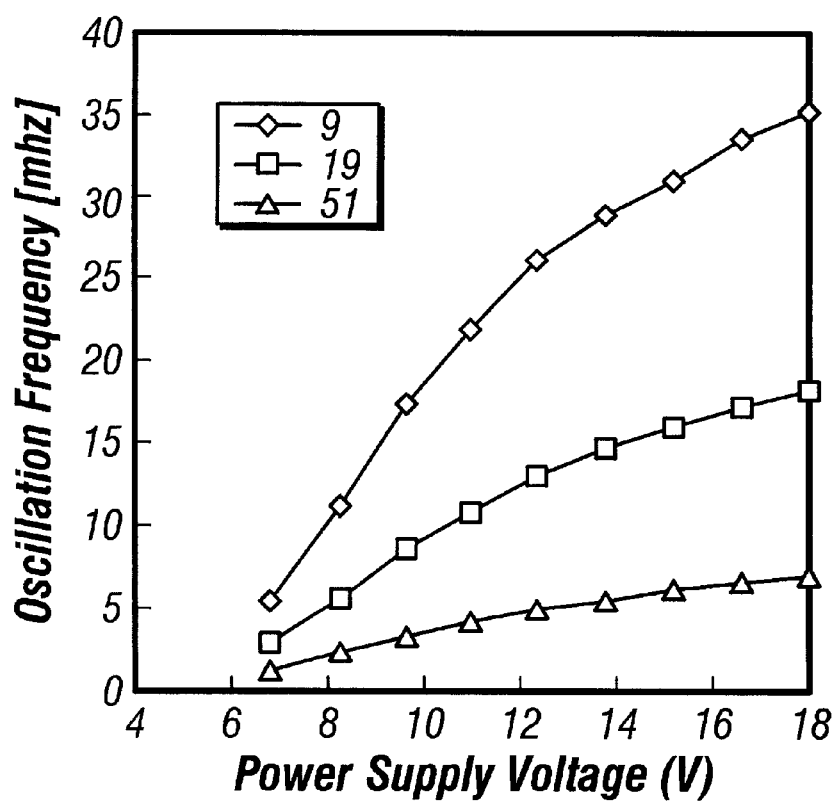
FIG. 11 shows measurement results of ring oscillators using the conventional TFTs in the third embodiment.

As seen from FIG. 10, for example, a ring oscillator of 19 stages has an oscillation frequency 62.6 MHz at a power supply voltage of 10 V, evidencing very high operation speed. FIG. 11 show measurement results of ring oscillators constructed by using CMOS circuits that were formed by CMOS circuits according to the third embodiment with an exception that the thermal oxidation step (i.e., the step for conversion into a single crystal) was not performed. Results with power supply voltages lower than 6 V are not shown because operation was not detected.

As seen from FIG. 11, for example, a ring oscillator of 19 stages has an oscillation frequency 6.5 MHz at a power supply voltage of 10 V. It has been found that the CMOS circuit according to the invention has operation speed that is about 10 times faster than a low-temperature polysilicon TFT that is formed under ordinary conditions.

It is certain that the S-value is very small as described in the third embodiment is one of major factors of the above experimental results. Therefore, in constructing a circuit capable of high-speed operation as described in this embodiment, it is necessary that the S-value of TFTs used be 85 mV/dec or less, preferably 75 mV/dec or less.

Embodiment 4

Figure 12A:
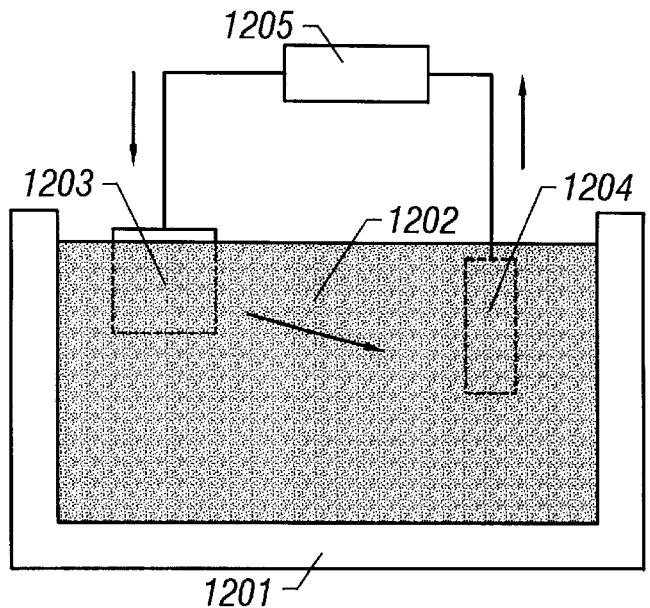
FIGS. 12A and 12B show the configurations of an anodization apparatus and a plasma oxidation apparatus, respectively.

The anodization step described in the first to third embodiments is a liquid phase treatment in which a substrate formed with wiring lines (anode) and a platinum electrode (cathode) are immersed in an electrolyte. FIG. 12A outlines an apparatus used.

As shown in FIG. 12A, a thermostatic oven 1201 is filled with an electrolyte 1202. For example, the electrolyte 1202 is a 3%-aqueous solution of oxalic acid when a porous anodic oxide is to be formed and an ethylene glycol solution of 3%-tartaric acid when a dense anodic oxide is to be formed.

A subject substrate 1203 (anode) and the platinum electrode 1204 (cathode) are immersed in the electrolyte 1202 and wires led out from respective terminals are connected to a potentiometer 1205. The potentiometer 1205 is a control device for keeping the current and voltage constant.

After the electrochemical circuit is constructed as shown in FIG. 12A, a constant current treatment is performed first. Once the voltage between the substrate 1203 and the platinum 1204 (to be correct, the voltage between wiring lines on the substrate 1203 and the electrolyte 1202) reaches an intended voltage, a constant voltage treatment is performed at that voltage. In this state, current flows in the direction indicated by an arrow in FIG. 12A and the wiring lines on the substrate 1203 are anodized being supplied with the current.

Figure 12B:
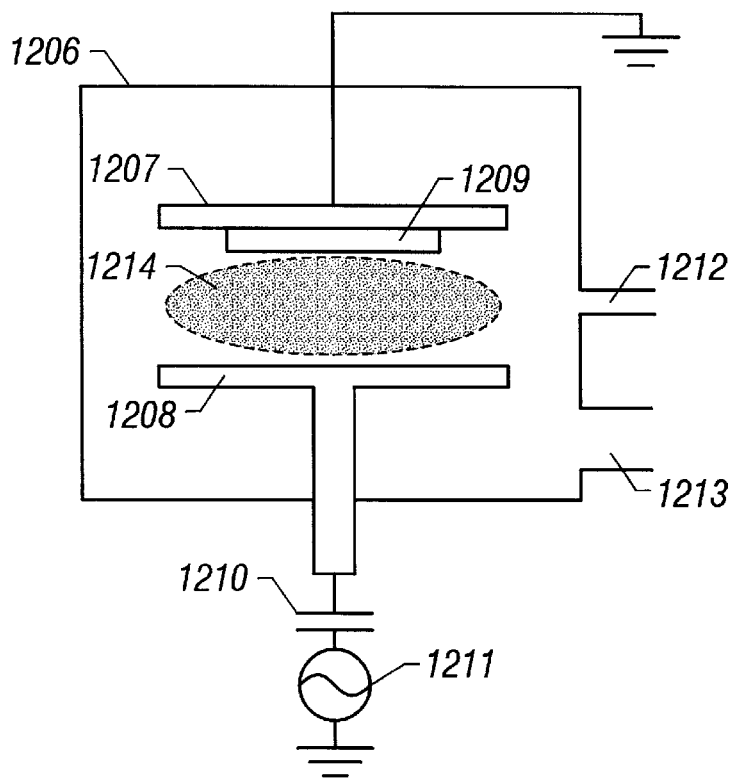

As another method for forming an oxide, a plasma oxidation method is known. Although the plasma oxidation method is applicable to formation of an oxide adjacent to the surface of a subject wiring line, it is not suitable for the purpose of the invention in which a wiring line itself is partially converted into an oxide. However, the plasma oxidation method can provide the same effect as the above-described anodization for the purpose of forming an oxide on the surface of a wiring line to protect it. FIG. 12B shows an example of the configuration of an apparatus for the plasma oxidation method.

As shown in FIG. 12B, a first electrode 1207 and a second electrode 1208 that are opposed to each other are disposed in a grounded processing chamber 1206. A substrate 1209 is held by the first electrode 1207, which is grounded. The second electrode 1208 is connected to an AC power supply 1211 via a blocking capacitor 1210 to allow application of an AC voltage.

A plasma excitation gas is introduced through an inlet 1212, and discharged from the processing chamber 1206 through an outlet 1213. The outlet 1213 is connected to a vacuum pump (not shown). This apparatus can be used as an ECR mode plasma apparatus if magnets etc. are provided for formation of a magnetic field.

In the plasma apparatus of FIG. 12B, a gas containing oxygen (plasma excitation gas) is introduced into the processing chamber 1206 through the inlet 1212, and an AC voltage is applied to the second electrode 1208, whereupon plasma 1214 is generated between the first electrode 1207 and the second electrode 1208. Wiring lines formed on the substrate 1209 are oxidized by oxygen plasma, so that an oxide whose composition includes the same substance as the wiring material is formed on the wiring lines.

As described above, an oxide for protecting wiring lines can be formed by not only the liquid phase anodization method but also the plasma oxidation method.
Embodiment 5

Figure 13:
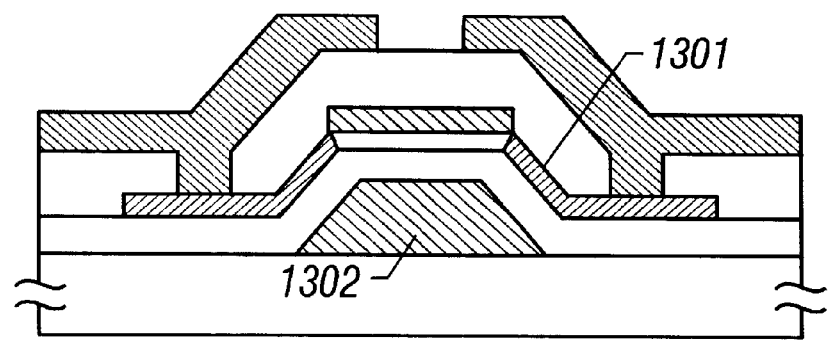
FIG. 13 shows the structure of a reversely staggered structure TFT according to a fifth embodiment of the invention.

Although the first to third embodiments are directed to the case of a planar TFT as a TFT to which the invention is applied, the invention can be practiced in forming other types of TFTs such as a reversely staggered structure TFT as shown in FIG. 13.

Details of a manufacturing process of a reversely staggered structure TFT are described in Japanese Unexamined Patent Publication No. Hei. 5-275452. Thus, basically a reversely staggered structure TFT may be formed by the known technology. Therefore, in this embodiment, details of a manufacturing method will not be described and only a completed structure is shown in FIG. 13, with an exception that a description will be made below which relates to an active layer 1301.

Where it is necessary to perform a heat treatment at 700° C. to 1,000° C., typically 950° C., as described in the second embodiment, such a process cannot be applied to manufacture of a reversely staggered structure TFT in which a gate electrode 1302 is formed before the active layer 1301.

In view of the above, in this embodiment which is directed to a reversely staggered structure TFT, the active layer 1301 is formed by using a crystalline silicon film that has been crystallized according to a technique disclosed in Japanese Unexamined Patent Publication No. Hei. 6-64834. The technique disclosed in this publication enables formation of a silicon film having a monodomain region at a temperature lower than a limit temperature that is determined by the heat resistance of the gate electrode 1301.
Embodiment 6

This embodiment is directed to examples of electro-optical devices, such as a liquid crystal display device, EL (electroluminescence) display device, and an EC (electrochromics) display device, that are constructed by using the semiconductor device according to the invention.

Figure 14:
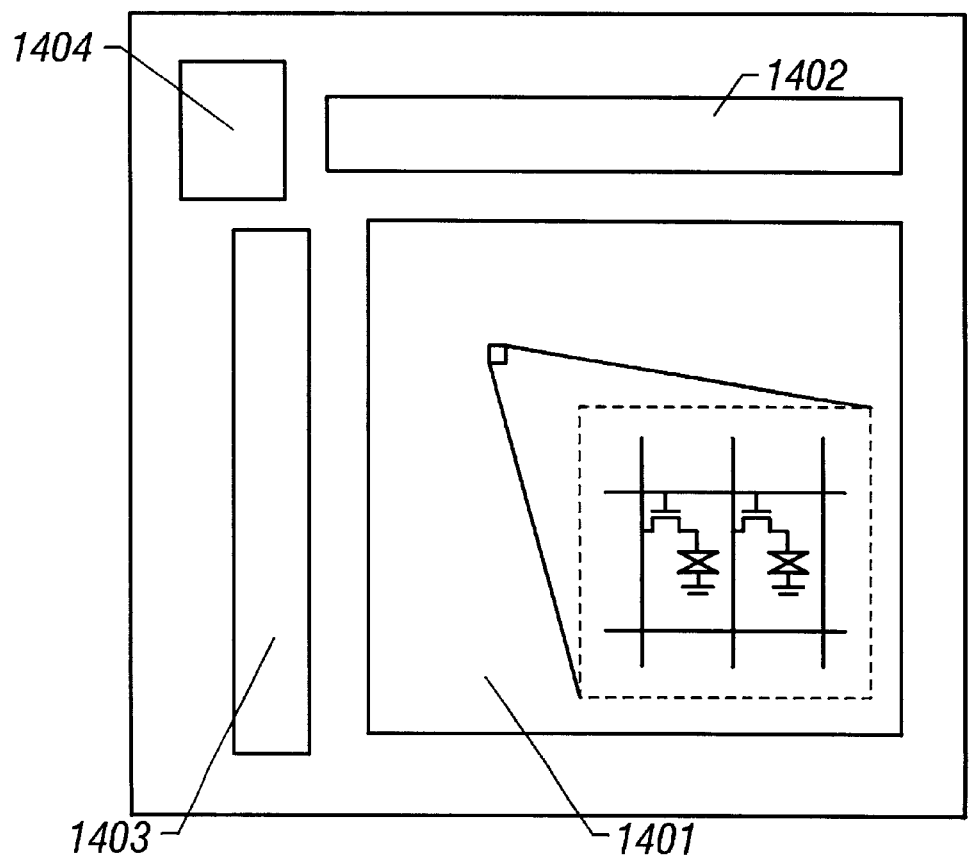
FIG. 14 shows the configuration of an active matrix liquid crystal display device according to a sixth embodiment of the invention.

For example, an active matrix liquid crystal display device in which a pixel matrix circuit and peripheral driver circuits are integrated on the same substrate may have a configuration shown in FIG. 14. FIG. 14 shows an integrated circuit of a SOG (system on glass) type display device including control circuits such as a memory circuit and a CPU circuit in addition to the pixel matrix circuit and the peripheral driver circuits.

Referring to FIG. 14, a pixel matrix circuit 1401, in which one million several hundred thousand TFTs are usually arranged in matrix form, controls voltages applied to a liquid crystal. A vertical scanning driver circuit 1402 and a horizontal scanning driver circuit 1403, each of which is constituted of a shift register circuit, a buffer circuit, a sampling circuit, and other circuits, controls gate signals and video signals. A control circuit 1404 includes a CPU circuit, a memory circuit, and other circuits.

The most important feature of the semiconductor device according to the invention is very high operation speed. Therefore it is most appropriate that the semiconductor of the invention be used, in the form of a CMOS circuit according to the third embodiment, in the peripheral driver circuits, in particular circuits such as a shift register circuit which are required to operate at high speed.

Examples of application products of active display devices such as the liquid crystal display device of FIG. 14, an EL display device, and a CL display device include a TV camera, a personal computer, a car navigation apparatus, a TV projection apparatus, and a video camera. Those application products will be described briefly with reference to FIGS. 15A to 15E.

Figure 15A:
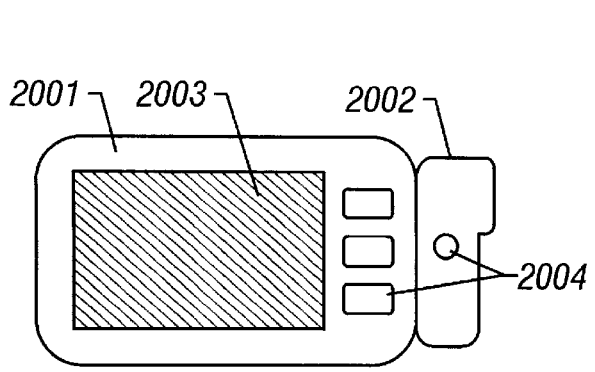
FIGS. 15A to 15E show examples of electro-optical devices to which the invention is applied (sixth embodiment)

FIG. 15A shows a TV camera, which consists of a main body 2001, a camera section 2002, a display device 2003, and manipulation switches 2004. The display device 2003 is used as a view finder.

Figure 15B:
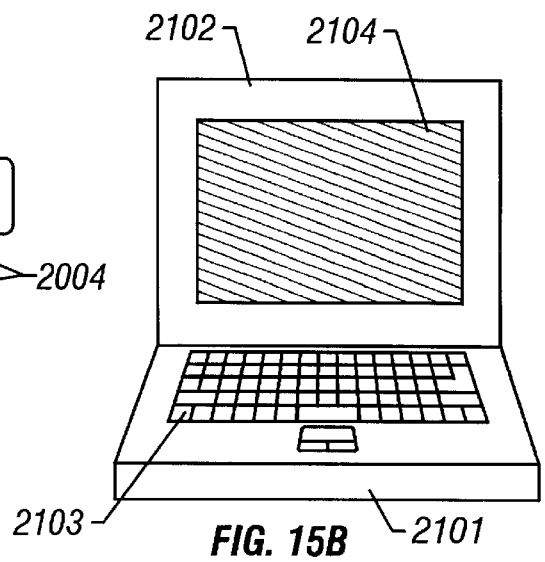

FIG. 15B shows a personal computer, which consists of a main body 2101, a cover section 2102, a keyboard 2103, and a display device 2104. The display device 2104, which is used as a monitor, may be required to have a diagonal size of ten plus several inches.

Figure 15C:
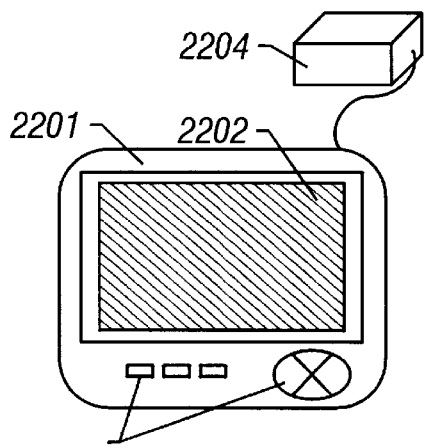

FIG. 15C shows a car navigation apparatus, which consists of a main body 2201, a display device 2202, manipulation switches 2203, and an antenna 2204. Although the display device 2202 is used as a monitor, the allowable resolution range is relatively wide because the main purpose is display of a map.

Figure 15D:
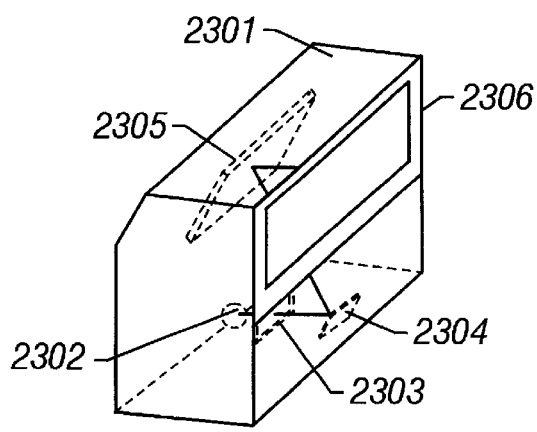

FIG. 15D shows a TV projection apparatus, which consists of a main body 2301, a light source 2302, a display device 2303, mirrors 2304 and 2305, and a screen 2306. The display device 2303 is required to have high resolution because an image formed on the display device is projected onto the screen 2306.

Figure 15E:
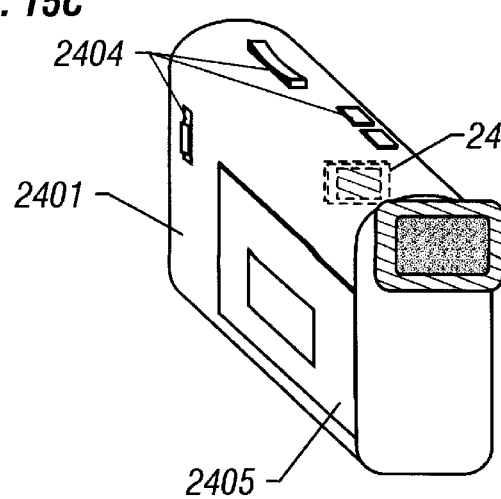

FIG. 15E shows a video camera, which consists of a main body 2401, a display device 2402, an eyepiece unit 2403, manipulation switches 2404, and a tape holder 2405. An image being taken that is displayed on the display device 2402 can be viewed through the eyepiece unit 2403 on a real-time basis. Therefore, a user can take a picture while watching a displayed image.

As described above, the application range of the invention is very wide; the invention can be applied to various products having a semiconductor circuit.

The invention provides the following advantages:

(1) Allows formation of an active layer by use of a silicon film that is as thin as 100 to 850 Å and has a region that can substantially be regarded as a single crystal.

(2) Realizes an intrinsic semiconductor layer that has a normally-off characteristic and hence is suitable for use as a channel-forming region because Eg is 1.3 to 1.9 eV, preferably 1.4 to 1.7 eV.

The above advantages indicate that the invention overcomes the problems of the conventional SOI technology and hence is very useful from the industrial viewpoint. The experimental data shown in FIGS. 6A to 6B and 10 clearly evidence the above advantages.

What is claimed is:

1. A semiconductor device having a pixel portion and a driving circuit, said driving circuit comprising a pair of an N-channel thin film transistor and a P-channel thin film transistor formed on an insulating surface, each of said N-channel and P-channel thin film transistors comprising:

a semiconductor film comprising silicon and having at least a channel forming region, said channel forming region comprising at least one domain in which a grain boundary does not exist;

a gate insulating film adjacent to said semiconductor film; and a gate electrode adjacent to said gate insulating film wherein said semiconductor film has a thickness of 100 to 850 Å, and wherein said thin film transistor has an S-value of 85 mV/dec or less.

2. The device according to claim 1 wherein said domain has no crystal defects such as lattice distortions and dislocations.

3. The device according to claims 1 wherein said semiconductor film has an energy band gap of 1.3 to 1.9 eV at a room temperature.

4. The device according to claim 3 wherein said energy band gap is defined as a value obtained by determining a wavelength dependence of effective transmittance of said semiconductor thin film by measuring an optical absorption spectrum thereof and then converting, into an energy value E, an absorption edge wavelength $\lambda$ at which the effective transmittance starts to decrease according to an equation $E=hc/\lambda$ where h is Planck constant and c is the speed of light.

5. The device according to claim 1 wherein said S-value is defined according to an equation $S=\ln 10(kT/q)\{1+(Cd+Cit)/Cox\}$ where the Cd is depletion layer capacitance, the Cit is equivalent capacitance of interface states, and the Cox is gate capacitance.

6. The device according to claim 1 wherein said gate insulating film has a thickness of 500 Å or more.

7. A device according to claim 1, wherein said gate electrode is formed on said channel forming region with said gate insulating film interposed therebetween.

8. A device according to claim 1, wherein said gate electrode is formed under said channel forming region with said gate insulating film interposed therebetween.

9. A semiconductor device having a pixel portion and a driving circuit, said driving circuit comprising a pair of an N-channel thin film transistor and a P-channel thin film transistor formed on an insulating surface, each of said N-channel and P-channel thin film transistors comprising:

a semiconductor film formed on said insulating surface, said semiconductor film comprising silicon and having at least one domain in which a grain boundary does not exist, wherein said semiconductor film absorbs light having a wavelength of 950 nm or less, and wherein said semiconductor film has a thickness of 100 to 850 Å.

10. The device according to claim 9 wherein said domain has no crystal defects such as lattice distortions and dislocations.

11. A device according to claim 9, wherein said N-channel and P-channel thin film transistors are top gate type thin film transistors.

12. A device according to claim 9, wherein said N-channel and P-channel thin film transistors are bottom gate type thin film transistors.

13. An electric device having a pixel portion and a driving circuit, said driving circuit comprising a pair of an N-channel thin film transistor and a P-channel thin film transistor formed on an insulating surface, each of said N-channel and P-channel thin film transistors comprising:

a semiconductor film having at least a channel forming region, a source region and a drain region, said channel forming region including at least one domain in which a grain boundary does not exist;

a gate insulating film adjacent to said semiconductor film; and a gate electrode adjacent to said gate insulating film, wherein said semiconductor film has a thickness of 100 to 850 Å, wherein said thin film transistor has an S-value of 85 mV/dec or less, and wherein said electric device is selected from the group consisting of a TV camera, a personal computer, a car navigation apparatus, a TV projection apparatus, and a video cameras.

14. A device according to claim 13, wherein said display device is a liquid crystal display device.

15. A device according to claim 13, wherein said display device is an electroluminescence display device.

16. A device according to claim 13, wherein said display device is an electrochromics display device.

17. A device according to claim 13, wherein said gate electrode is formed on said channel forming region with said gate insulating film interposed therebetween.

18. A device according to claim 13, wherein said gate electrode is formed under said channel forming region with said gate insulating film interposed therebetween.

19. An electric device having a pixel portion and a driving circuit, said driving circuit comprising a pair of an N-channel thin film transistor and a P-channel thin film transistor formed on an insulating surface, each of said N-channel and P-channel thin film transistors comprising:

a semiconductor film formed on said insulating surface, said semiconductor film comprising silicon and having at least one domain in which a grain boundary does not exist, wherein said semiconductor film absorbs light having a wavelength of 950 nm or less, wherein said semiconductor film has a thickness of 100 to 850 Å, and wherein said electric device is selected from the group consisting of a TV camera, a personal computer, a car navigation apparatus, a TV projection apparatus, and a video camera.

20. A device according to claim 19, wherein said display device is a liquid crystal display device.

21. A device according to claim 19, wherein said display device is an electroluminescence display device.

22. A device according to claim 19, wherein said display device is an electrochromics display device.

23. A device according to claim 19, wherein said N-channel and P-channel thin film transistors are top gate type thin film transistors.

24. A device according to claim 19, wherein said N-channel and P-channel thin film transistors are bottom gate type thin film transistors.

25. A display device having a pixel portion and a driving circuit, said driving circuit comprising a pair of an N-channel thin film transistor and a P-channel thin film transistor formed on an insulating surface, each of said N-channel and P-channel thin film transistors comprising:

a semiconductor film comprising silicon and having at least a channel forming region, a source region, and a drain region, said channel forming region comprising at least a monodomain region;

a gate insulating film adjacent to said semiconductor film; and a gate electrode adjacent to said gate insulating film, wherein said semiconductor film has a thickness of 100 to 850 Å, and wherein said thin film transistor has an S-value of 85 mV/dec or less.

26. A device according to claim 25, wherein said display device is a liquid crystal display device.

27. A device according to claim 25, wherein said display device is an electroluminescence display device.

28. A device according to claim 25, wherein said display device is an electrochromics display device.

29. A device according to claim 25, wherein said gate electrode is formed on said channel forming region with said gate insulating film interposed therebetween.

30. A device according to claim 25, wherein said gate electrode is formed under said channel forming region with said gate insulating film interposed therebetween.

31. A display device having a pixel portion and a driving circuit, said driving circuit comprising a pair of an N-channel thin film transistor and a P-channel thin film transistor formed on an insulating surface, each of said N-channel and P-channel thin film transistors comprising:

a semiconductor film formed on said insulating surface, said semiconductor film comprising silicon and having at least a monodomain region, wherein said semiconductor film absorbs light having a wavelength of 950 nm or less, and wherein said semiconductor film has a thickness of 100 to 850 Å.

32. A device according to claim 31, wherein said display device is a liquid crystal display device.

33. A device according to claim 31, wherein said display device is an electroluminescence display device.

34. A device according to claim 31, wherein said display device is an electrochromics display device.

35. A device according to claim 31, wherein said N-channel and P-channel thin film transistors are top gate type thin film transistors.

36. A device according to claim 31, wherein said N-channel and P-channel thin film transistors are bottom gate type thin film transistors.

37. An electroluminescence display device having at least one thin film transistor formed on an insulating surface, said thin film transistor comprising:

a semiconductor film comprising silicon and having at least a channel forming region, a source region, and a drain region, said channel forming region comprising at least one domain in which a grain boundary does not exist;

a gate insulating film adjacent to said semiconductor film; and a gate electrode adjacent to said gate insulating film, wherein said semiconductor film has a thickness of 100 to 850 Å, and wherein said thin film transistor has an S-value of 85 mV/dec or less.

38. A device according to claim 37, wherein said gate electrode is formed on said channel forming region with said gate insulating film interposed therebetween.

39. A device according to claim 37, wherein said gate electrode is formed under said channel forming region with said gate insulating film interposed therebetween.

40. An electroluminescence display device having at least one thin film transistor formed on an insulating surface, said thin film transistor comprising:

a semiconductor film comprising silicon formed on an insulating surface, said semiconductor film having at least one domain in which a grain boundary does not exist, wherein said semiconductor film absorbs light having a wavelength of 950 nm or less, and wherein said semiconductor film has a thickness of 100 to 850 Å.

41. A device according to claim 40, wherein said thin film transistor is a top gate type thin film transistor.

42. A device according to claim 40, wherein said thin film transistor is a bottom gate type thin film transistor.

* * * * *